US012002692B2

(12) United States Patent
Isomura et al.

(10) Patent No.: US 12,002,692 B2
(45) Date of Patent: *Jun. 4, 2024

(54) OPERATION METHOD OF VACUUM PROCESSING DEVICE

(71) Applicant: Hitachi High-Tech Corporation, Tokyo (JP)

(72) Inventors: Ryoichi Isomura, Tokyo (JP); Keitarou Ogawa, Tokyo (JP); Takahiro Sakuragi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 57 days.

This patent is subject to a terminal disclaimer.

(21) Appl. No.: 17/507,932

(22) Filed: Oct. 22, 2021

(65) Prior Publication Data
US 2022/0051917 A1   Feb. 17, 2022

Related U.S. Application Data

(63) Continuation of application No. 16/362,002, filed on Mar. 22, 2019, now Pat. No. 11,195,733.

(30) Foreign Application Priority Data

Mar. 23, 2018   (JP) ................................. 2018-055589

(51) Int. Cl.
   *H01L 21/67*   (2006.01)
   *H01L 21/677*  (2006.01)
(52) U.S. Cl.
   CPC .. *H01L 21/67184* (2013.01); *H01L 21/67017* (2013.01); *H01L 21/67161* (2013.01); *H01L 21/67196* (2013.01); *H01L 21/67201* (2013.01); *H01L 21/67742* (2013.01)
(58) Field of Classification Search
   CPC .................................. H01L 21/67184
   USPC ....................................................... 414/217
   See application file for complete search history.

(56) References Cited

U.S. PATENT DOCUMENTS

| 7,022,613 | B2 | 4/2006 | Pomarede et al. |
| 7,024,266 | B2 | 4/2006 | Edo |
| 8,029,226 | B2 | 10/2011 | van der Meulen |
| 8,747,046 | B2 | 6/2014 | Isomura et al. |
| 9,385,015 | B2 | 7/2016 | Yamawaku et al. |
| 2008/0138176 | A1 | 6/2008 | Kim et al. |
| 2008/0170970 | A1 | 7/2008 | Ito et al. |

(Continued)

FOREIGN PATENT DOCUMENTS

| JP | 2012074496 A | 4/2012 |
| JP | 2012138542 A | 7/2012 |
| JP | 2014179431 A | 9/2014 |

*Primary Examiner* — Saul Rodriguez
*Assistant Examiner* — Willie W Berry, Jr.
(74) *Attorney, Agent, or Firm* — Miles & Stockbridge, P.C.

(57) ABSTRACT

According to one embodiment, a vacuum processing device is provided which is capable of being controlled to create the most suitable gas flow under the situation where the device is placed by allowing a plurality of vacuum transfer chambers to communicate with each other via the intermediate chamber in an operation method of the vacuum processing device including the plurality of vacuum transfer chambers connected to each other via the intermediate chamber and a plurality of vacuum processing chambers respectively connected to the vacuum transfer chambers.

10 Claims, 10 Drawing Sheets

(56) References Cited

U.S. PATENT DOCUMENTS

| | | |
|---|---|---|
| 2010/0297786 A1 | 11/2010 | Terashima et al. |
| 2011/0110752 A1 | 5/2011 | Tauchi et al. |
| 2012/0027542 A1 | 2/2012 | Isomura et al. |
| 2012/0163943 A1 | 6/2012 | Isomura et al. |
| 2013/0309045 A1* | 11/2013 | Kobayashi ........ H01L 21/67184 414/217 |
| 2013/0343841 A1 | 12/2013 | van der Meulen |
| 2014/0271049 A1 | 9/2014 | Isomura et al. |

* cited by examiner

OPERATION METHOD OF VACUUM PROCESSING DEVICE

BACKGROUND OF THE INVENTION

1. Field of the Invention

The present invention relates to a vacuum processing device including a plurality of processing units that process a sample which is an object to be processed in a processing chamber disposed inside a vacuum vessel by using plasma generated in the processing chamber and an operation method thereof, and more particularly, to a vacuum processing device in which each of the plurality of vacuum processing units is connected to each of the plurality of vacuum transfer chambers that are connected to each other via an intermediate chamber capable of storing the sample and an operation method thereof.

2. Description of Related Art

As an example of a related art of such a vacuum processing device, a device described in JP-A-2014-179431 is known. In the related art, disclosed is a vacuum processing device, including: first and second vacuum transfer vessels that include a vacuum transfer chamber whose inside is depressurized and to which a wafer is transferred; first and second vacuum processing vessels that are connected to each of the vacuum transfer vessels and include a processing chamber communicating with the vacuum transfer chamber connected to the inside of each of the vacuum transfer vessels; an intermediate chamber vessel that is disposed to be connected between the first and second vacuum transfer vessels and includes a storage chamber capable of storing the wafer therein; a lock chamber that is connected to the first vacuum transfer vessel disposed on the front side of the vacuum processing device of the first and second vacuum transfer vessels, and whose space for storing the wafer therein is capable of communicating with the vacuum transfer chamber in the first vacuum transfer vessel; and a plurality of gate valves that is disposed between the first and second vacuum transfer vessels and each of the vacuum processing vessels, the intermediate chamber vessel, and the lock chamber that are respectively connected to each of the first and second vacuum transfer vessels and opens and airtightly closes communication therebetween.

Particularly, in the related art, while an inert gas (noble gas) is supplied as a purge gas to the vacuum transfer chamber in the first vacuum transfer vessel to which the lock chamber is connected among the vacuum transfer chambers inside the first and second vacuum transfer chambers that communicate with each other via the intermediate chamber vessel, the inside of the vacuum transfer chamber in the second vacuum transfer vessel disposed at a position farther from the lock chamber is depressurized and exhausted. Further, pressure in the plurality of vacuum processing chambers that are disposed to communicate with each of the vacuum transfer chambers in the first and second vacuum transfer vessels is set to be lower than pressure inside the vacuum transfer chamber in the first or second vacuum transfer vessel, and when communication between the vacuum transfer chamber and the vacuum processing chamber is opened, particles in the vacuum processing chamber flow into the vacuum transfer chamber and flow into another vacuum transfer chamber communicating with the aforementioned vacuum transfer chamber via the inside of the intermediate chamber vessel, whereby the particles having high adhesion or reactivity generated in the vacuum processing chamber in one arbitrary processing vessel reach the vacuum processing chamber in another vacuum processing vessel connected to another vacuum transfer chamber, thereby suppressing the occurrence of so-called cross contamination that means a substrate-like sample which is an object to be processed such as a semiconductor wafer processed on the surface of an internal member or inside is contaminated, and thus improving productivity per high installation area.

In the above-mentioned related art, when the wafer is transferred by a vacuum transfer robot in the vacuum transfer chamber, a valve disposed between the vacuum transfer chamber in which the wafer is being transferred and another vacuum transfer chamber is put in an open state; a purge gas is supplied to the vacuum transfer chamber connected to the lock chamber; and a gas flow to the whole vacuum transfer chambers communicating with each other is created by depressurizing and exhausting the inside of the vacuum transfer chamber of the vacuum transfer vessel far from the lock chamber, thereby making it possible to prevent secondary contamination of the device or the wafer caused by the outflow of atmosphere from the vacuum processing chamber, and to improve the productivity per installation area of the vacuum processing device by reducing valve operation time.

However, in the related art, there exists a problem that the following points are not sufficiently considered.

That is, the volume of the vacuum transfer robot provided in the vacuum transfer chamber is not relative small in contrast with than the volume of the vacuum transfer chamber. Therefore, when the purge gas is introduced into the vacuum transfer chamber while the vacuum transfer robot provided in the vacuum transfer chamber is in operation in order to transfer a sample, a flow of the purge gas in the vacuum transfer chamber is considerably inhibited.

When such an inhibition occurs, a substance causing the occurrence of contamination of a sample such as a foreign matter floating in the vacuum transfer chamber and a gas discharged from the sample is not effectively exhausted to the outside of the vacuum transfer chamber by the purge gas, such that the substance or the like stays in a space where the flow of the purge gas in the vacuum transfer chamber does not reach, and the action of suppressing the contamination of the sample which is the purpose of supplying the purge gas is inhibited. Further, it is required to clean the inside of the vacuum transfer chamber for a shorter period of time in order to suppress the occurrence of such contamination, such that processing efficiency of the sample in the vacuum processing device may deteriorate during the time when the inside of the vacuum transfer chamber is cleaned.

As described above, in the related art, it is not sufficiently considered to select and create the gas flow capable of effectively transferring the substance causing the contamination of the sample without attaching the substance to the sample in the vacuum processing device, and a fact that the processing efficiency by the vacuum processing device may deteriorate is not also sufficiently considered.

SUMMARY OF THE INVENTION

Embodiments can include an operation method of a vacuum processing apparatus comprising two vacuum transfer vessels configured to include a transfer chamber in which a wafer which is an object to be processed is transferred in a depressurized inside, and to be disposed side by side in a front and rear direction; an intermediate chamber vessel configured to be disposed to be connected between the two vacuum transfer vessels, and to include an intermediate chamber communicating with each of the two vacuum transfer chambers therein; and a plurality of vacuum processing vessels configured to be connected to each of the two vacuum transfer vessels, and to include a processing chamber in which the wafer is transferred and processed by using plasma therein, which transfers the wafer to each of the plurality of vacuum processing vessels and processes the wafer therein. Each of the two vacuum transfer vessels includes a transfer robot configured to transfer the wafer to the inside of each of the vacuum transfer chambers; at least one supply port configured to include an opening on an inner wall of the vacuum transfer chamber behind the transfer robot in the front and rear direction, and to supply a gas toward a center side of the vacuum transfer chamber; and one exhaust port configured to include an opening on an inner wall of the vacuum transfer chamber in front of the transfer robot, and to exhaust the gas, wherein the at least one supply port and the exhaust port are respectively disposed on either right or left side in a front and rear axial direction passing through a center of the intermediate chamber.

The operation method includes performing a first operation in which, in each of the two vacuum transfer vessels, a gas is supplied between a pair of the at least one supply port and the exhaust port in the front and rear direction among the gas supply ports and the exhaust ports of the two vacuum transfer vessels; and performing a second operation in which, while the two transfer robots are not in operation, the gas is supplied from the at least one supply port of the one vacuum transfer vessel disposed in rear side of the two vacuum transfer vessels and is introduced, via the intermediate chamber, into the other vacuum transfer vessel disposed in front side of the two vacuum transfer vessels, and the gas is exhausted from the exhaust port of the other vacuum transfer vessels.

For example, when the vacuum transfer robot provided in the vacuum transfer vessel performs an operation of transferring a substrate to the plurality of vacuum processing vessels connected to the vacuum transfer vessel, the plurality of vacuum transfer chambers are allowed to communicate with each other via the intermediate chamber, and the command device respectively performs the opening and closing control so that the purge gas introduction port and the exhaust port become the shortest distance via the intermediate chamber, thereby achieving the creation of the gas flow. On the other hand, when the vacuum transfer robot provided in the vacuum transfer vessel does not perform the operation of transferring the substrate to the plurality of vacuum processing vessels connected to the vacuum transfer vessel, the plurality of vacuum transfer chambers are allowed to communicate with each other via the intermediate chamber, and the command device respectively performs the opening and closing control so that the purge gas introduction port and the exhaust port become the longest distance via the intermediate chamber, thereby achieving the creation of the gas flow.

DESCRIPTION OF EMBODIMENTS

Hereinafter, an embodiment of a vacuum processing device according to the present invention will be described in detail with reference to the accompany drawings.

Figure 1:
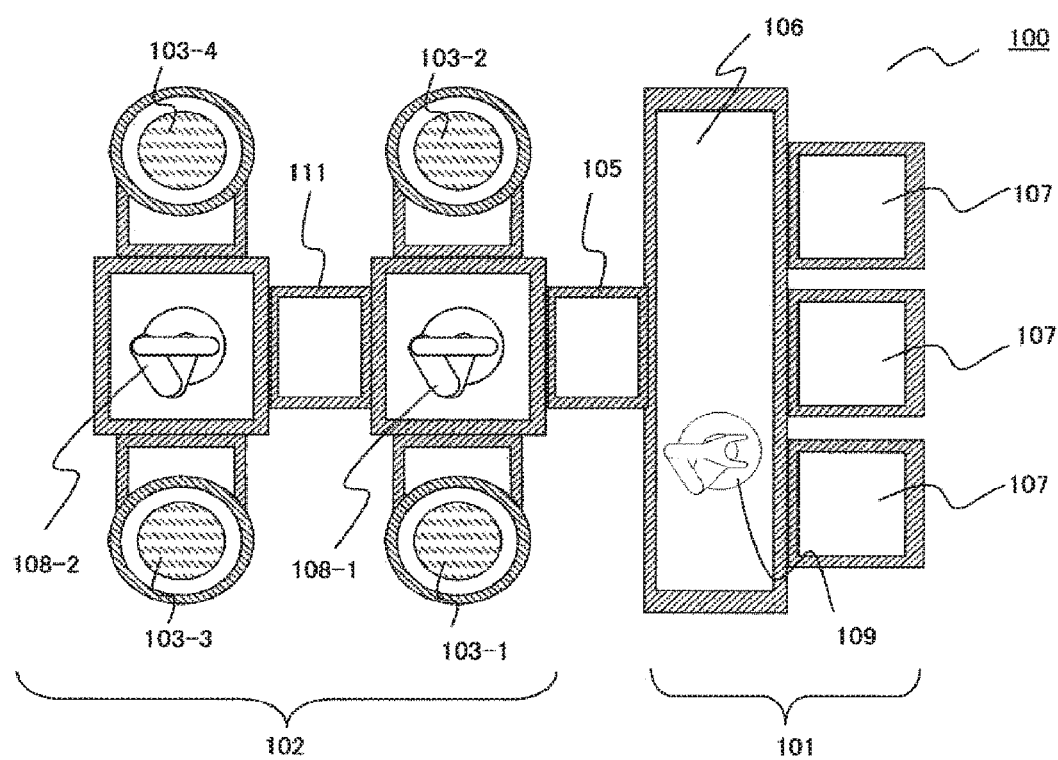
FIG. 1 is a diagram illustrating an outline of a configuration of a vacuum processing device according to an embodiment of the present invention.
Figure 2:
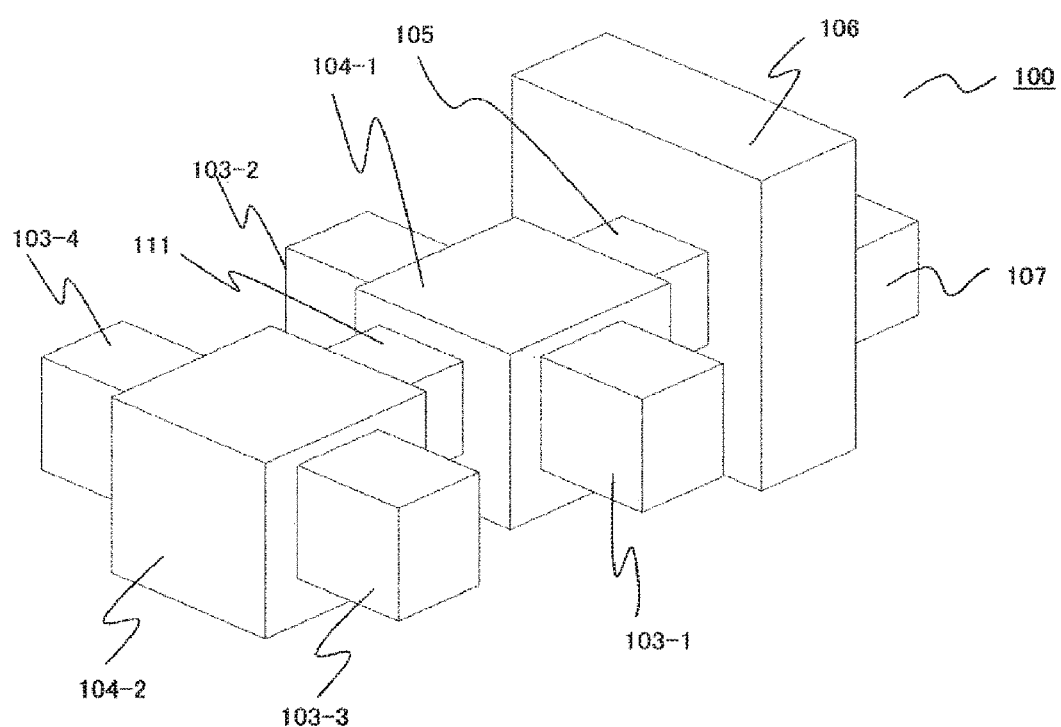
FIG. 2 is a perspective view of the vacuum processing device according to the embodiment illustrated in FIG. 1.
Figure 3:
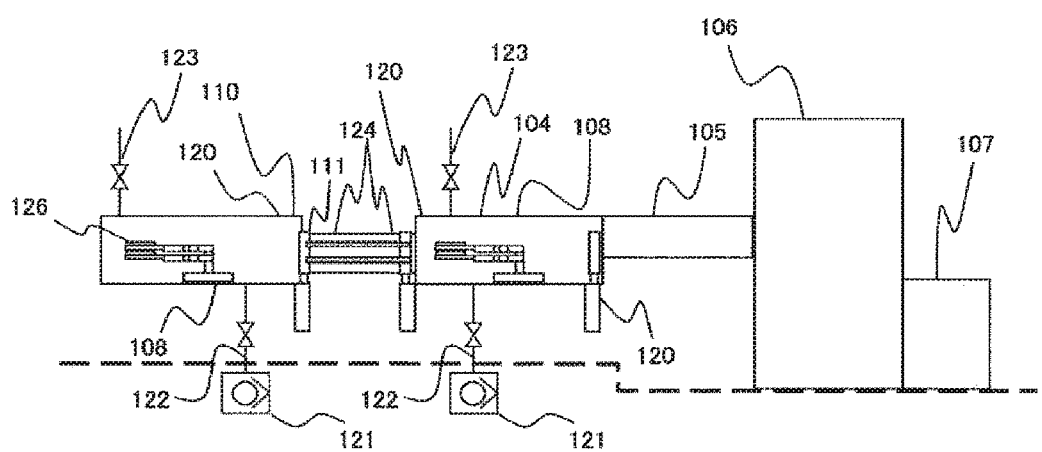
FIG. 3 is a longitudinal sectional view of a longitudinal section of the vacuum processing device according to the embodiment illustrated in FIG. 1 when viewed from a lateral direction.

A vacuum processing device according to the embodiment of the present invention will be described with reference to FIGS. 1 to 9. FIGS. 1 to 3 are diagrams illustrating an outline of a configuration of the vacuum processing device according to the embodiment of the present invention. FIG. 1 illustrates a cross sectional view of a cross section when viewed from above; FIG. 2 illustrates a perspective view of the vacuum processing device according to the embodiment illustrated in FIG. 1; and FIG. 3 illustrates a longitudinal sectional view of a longitudinal section of the vacuum processing device according to the embodiment illustrated in FIG. 1 when viewed from a lateral direction.

A vacuum processing device 100 according to the embodiments of the present invention illustrated in FIGS. 1 to 3 is configured to be largely divided into an atmospheric side block 101 and a vacuum side block 102. The atmospheric side block 101 is a part that performs transference, storage position determination, and the like of a substrate-shaped sample such as a semiconductor wafer which is object to be processed under atmospheric pressure, and the vacuum side block 102 is a block that transfers the substrate-shaped sample such as a wafer under pressure depressurized from the atmospheric pressure, and performs processing in a predetermined vacuum processing chamber. Further, a portion that is disposed to connect the vacuum side block 102 and the atmospheric side block 101, and that raises and lowers the pressure between the atmospheric pressure and vacuum pressure in a state where the sample is held therein is disposed between a place of the vacuum side block 102 that performs the transference and processing as described above in the vacuum side block 102 and the atmospheric side block 101.

The atmospheric side block 101 includes an approximately rectangular parallelepiped casing 106 that is provided with an atmospheric side transfer robot 109 therein; and a plurality of cassette tables 107 which are mounted on a front side of the casing 106 and on which cassettes for storing the substrate-shaped sample (hereinafter, referred to as a "wafer 126") such as the semiconductor wafer which is an object to be processed for processing or cleaning is placed.

The vacuum side block 102 includes a first vacuum transfer chamber 104, a second vacuum transfer chamber 110, and one or a plurality of lock chambers 105 that is disposed between the first and second vacuum transfer chambers and the atmospheric side block 101, and exchanges the pressure between the atmospheric pressure and the vacuum pressure in a state where the wafer 126 being exchanged between the atmospheric side and the vacuum side. The lock chamber 105 is a vacuum vessel capable of adjusting an internal space to the above-mentioned pressure, and includes a passage through which the wafer 126 passes inside and is transferred and a valve 120 capable of performing airtight sealing by opening and closing the passage are disposed at a connected position, such that the atmospheric side and vacuum side are airtightly divided. Further, the lock chamber 105 is provided with a storage part capable of storing and holding the plurality of wafers 126 in a vertically spaced manner in the internal space, and is closed by the valve 120 in a state where the wafers 126 are stored therein, thereby being airtightly divided.

The first vacuum transfer chamber 104 and the second vacuum transfer chamber 110 are units including vacuum vessels respectively having an approximately rectangular planar shape, and those are two units having a configuration difference which can be considered as substantially the same as each other. The first vacuum transfer chamber 104 and the second vacuum transfer chamber 110 are respectively provided with a purge line 123. Further, an exhaust pipe 122 is provided on a surface positioned at a diagonal angle to a surface provided with the purge line 123, and is configured to be capable of being adjusted to a pressure value relatively lower than those of another vacuum processing chamber 103 and a vacuum transfer intermediate chamber 111, or a pressure value that is the same as those thereof or is approximate to a level to be considered as the same as those thereof, or a pressure value relatively higher than those thereof in such a manner that a purge gas such as an inert gas whose flow rate is adjusted based upon a command signal from a control part of the vacuum processing device 100 which is not illustrated is introduced into the vacuum transfer chamber such that the inside of the vacuum transfer chamber is exhausted.

The vacuum transfer intermediate chamber 111 is a vacuum vessel whose inside can be depressurized up to a pressure relatively higher than that of other vacuum processing chambers, and allows the vacuum transfer chambers to be connected to each other such that the internal chambers communicate with each other. The valve 120 that opens, shuts off, and thus divides a passage through which the wafer 126 is transferred inside by communicating with the inside chamber is disposed between the vacuum transfer chambers, and the vacuum transfer intermediate chamber and the vacuum transfer chamber are airtightly sealed by closing the valve 120. The vacuum transfer intermediate chamber 111 according to the embodiment is not provided with a mechanism for purging or exhausting a space for storing the wafer 126 therein, and the vacuum transfer intermediate chamber 111 is a chamber that functions as a pathway when the wafer 126 is transferred between one vacuum transfer chamber and the other vacuum transfer chamber which are connected to each other with the vacuum transfer intermediate chamber 111 interposed therebetween.

Further, a chamber inside the vacuum transfer intermediate chamber 111 includes a storage part in which the plurality of wafers 126 are horizontally held with a gap between an upper surface of the wafer 126 and a lower surface of other wafer in a state where respective opposite ends thereof are placed; and a function of a relay chamber in which the wafer 126 is temporarily stored when the wafer 126 is delivered between the first and second vacuum transfer chambers 104 and 110. That is, the wafer 126 that is carried by any of the vacuum transfer robots 108 in one vacuum transfer chamber and is placed on the storage part is carried out by any of the vacuum transfer robots 108 in the other vacuum transfer chamber, and then is transferred to the vacuum processing chamber 103 or the lock chamber 105 connected to the vacuum transfer chamber.

The vacuum transfer intermediate chamber 111 is disposed between mutual side walls facing each other, corresponding to one side of the first vacuum transfer chamber 104 and one side of the second vacuum transfer chamber 110 such that the first vacuum transfer chamber 104 and the second vacuum transfer chamber 110 are connected to each other. Further, the other side is connected to the vacuum processing chamber 103 whose inside is depressurized, to which the wafer 126 is transferred, and in which the wafer 126 is processed. In the embodiment, the vacuum processing chamber 103 indicates the whole units including an electric field configured to include a vacuum vessel, a unit for generating a magnetic field, and an exhaust unit including a vacuum pump for exhausting a depressurized space inside the vessel, and etching processing, ashing processing or processing of other semiconductor wafer 126 is performed in the internal processing chamber.

Further, a pipe line through which a processing gas supplied according to the processing to be performed flows is connected to each vacuum processing chamber 103. Each vacuum processing chamber 103 is capable of being depressurized up to pressure relatively lower than pressure of another vacuum transfer chamber and that of the vacuum transfer intermediate chamber, and is capable of adjusting each of the internal pressure by receiving a command from a command device which is not illustrated according to the processing to be performed in each of the vacuum processing chambers. That is, when the types of processing to be performed on the wafer 126 are set to be different from each other in the plurality of vacuum processing chambers, the pressure inside each of the vacuum processing chambers is not all the same pressure, but is adjusted to optimum pressure for each processing, such that the pressure in the vacuum processing chambers may be different.

Two vacuum processing chambers 103 are configured to be respectively connectable to the first vacuum transfer chamber 104 and the second vacuum transfer chamber 110, and in the embodiment, two vacuum processing chambers 103 are connected to the first vacuum transfer chamber 104 and the second vacuum transfer chamber 110.

The insides of the first vacuum transfer chamber 104 and the second vacuum transfer chamber 110 are formed as a transfer chamber, and in the first vacuum transfer chamber 104, the vacuum transfer robot 108 for transferring the wafer 126 between the lock chamber 105 and either the vacuum processing chamber 103 or the vacuum transfer intermediate chamber 111 under the vacuum is disposed at a center portion of the internal space thereof. In the same manner, in the second vacuum transfer chamber 110 as well, the vacuum transfer robot 108 is disposed at a center portion of the internal space thereof, and the wafer 126 is transferred between the vacuum processing chamber 103 and any one of the vacuum transfer intermediate chambers 111. Respective configurations of the vacuum transfer robots 108 are the same as each other.

The wafer 126 is placed on the arm of the vacuum transfer robot 108, and in the first vacuum transfer chamber 104, the wafer 126 is carried in and out between a support table of the wafer 126 disposed in the vacuum processing chamber 103 and either the lock chamber 105 or the first vacuum transfer intermediate chamber 111. A passage is provided between the vacuum transfer chamber 103, the lock chamber 105, the vacuum transfer intermediate chamber 111, the first vacuum transfer chamber 104, and the second vacuum transfer chamber 110, and the passage communicates therewith by the valve 120 capable of airtightly closing and opening respective ones, and is opened and closed by the valve 120.

Hereinafter, in the embodiment, the time (transfer time) required for transferring the wafer 126 in the vacuum block 102 until the wafer 126 before processing is carried out from the lock chamber 105 and is carried in the vacuum processing unit 103 of a predetermined vacuum processing unit which is a place where the processing is performed, and then the vacuum processing chamber 103 is sealed is set to be longer than that in the atmospheric side block 101; processing efficiency is improved by reducing the transfer time during which the wafer 126 is transferred on a transfer path via the vacuum transfer chamber, the intermediate chamber, and the vacuum processing chamber forming the block; and at the same time, an atmosphere such as a processing gas used for processing the wafer 126 in each vacuum processing chamber 103 is set to be prevented from flowing into another vacuum processing chamber 103 or contacting (hereinafter, referred to as contamination) an atmosphere such as a processing gas used when processing the wafer 126 in another vacuum processing chamber 103, thereby making it possible to improve production efficiency per unit time of the device.

Next, an operation of processing the wafer 126 in such a vacuum processing device 100 will be hereinafter described.

The plurality of wafers 126 that are stored in a cassette placed on any of the cassette tables 107 starts the processing by receiving a command from a command device, which is not illustrated, that adjusts the operation of the vacuum processing device 100 and is connected to the vacuum processing device 100 by any communication unit, or by receiving a command from an instruction device, and the like of a manufacturing line on which the vacuum processing device 100 is installed. The atmospheric side transfer robot 109 receiving the command from the command device takes out the specific wafer 126 in the cassette from the cassette, and then transfers the wafer 126 taken out therefrom to the lock chamber 105.

For example, in the lock chamber 105 where the wafer 126 is transferred therein and stored, the valve 120 is closed and sealed in a state where the transferred wafer 126 is stored, thereby being depressurized up to a predetermined pressure. Thereafter, in the lock chamber 105, the valve 120 on the side facing the first vacuum transfer chamber 104 is opened, whereby the lock chamber 105 and the transfer chamber of the first vacuum transfer chamber 104 communicate with each other.

The vacuum transfer robot 108 extends the arm thereof into the lock chamber 105, receives the wafer 126 in the lock chamber 105 on a support portion of the wafer 126 at a tip part of the arm, and carries out the received wafer 126 into the first vacuum transfer chamber 104. Further, the first vacuum transfer robot 108 carries the wafer 126 placed on the arm into either the vacuum processing chamber 103 or the vacuum transfer intermediate chambers 111 connected to the first vacuum transfer chamber 104 along a transfer path previously specified by the command device when the wafer 126 is taken out from the cassette. For example, thereafter, the wafer 126 transferred to the vacuum transfer intermediate chamber 111 is carried out from the vacuum transfer intermediate chamber 111 to the second vacuum transfer chamber 110 by the vacuum transfer robot 108 provided in the second vacuum transfer chamber 110, and then is carried into any of the vacuum processing chambers 103 which is the destination of the predetermined transfer path.

After the wafer 126 is transferred to one vacuum processing chamber 103, the valve 120 that opens and closes a space between the vacuum processing chamber 103 and the first vacuum transfer chamber 104 connected thereto is closed, thereby sealing the vacuum processing chamber. After that, the processing gas is introduced into the vacuum processing chamber and the inside of the vacuum processing chamber is adjusted to a pressure suitable for the processing. An electric field or a magnetic field is supplied to the vacuum processing chamber and thus the processing gas is excited, whereby plasma is formed in the vacuum processing chamber and the wafer 126 is processed.

The valve 120, which opens and closes the space between one vacuum processing chamber 103 in which the wafer 126 is processed and the vacuum transfer chamber to which the vacuum processing chamber 103 is connected, receives the command from the command device, and is opened in a state where another vacuum valve 120 capable of opening and closing a space including the vacuum transfer chamber that is connected to and communicates with the space is closed. For example, before opening the valve 120 by which one vacuum processing chamber 103 and the vacuum transfer chamber to which the vacuum processing chamber 103 is connected are partitioned, the command device commands an operation of closing or confirming the closing any of the valves 120 that opens and closes a gate disposed on a passage where the wafers 126 of the respective vacuum processing chambers are transferred through the inside so that the vacuum processing chamber does not communicate with another vacuum processing chamber. After the confirmation thereof, the valve 120 that seals one vacuum processing chamber 103 is opened.

When it is detected that the processing of the wafer 126 is completed, after it is confirmed that the valve 120 between another vacuum processing chamber 103 and the second vacuum transfer chamber 110 is closed and the space therebetween is airtightly sealed, the valve 120 that opens and closes the space between one vacuum processing chamber 103 and the second vacuum transfer chamber 110 to which one vacuum processing chamber 103 is connected is opened, and then the vacuum transfer robot 108 carries out the processed wafer 126 into the inside thereof, after which the wafer 126 is transferred to the lock chamber 105 via a transfer path opposite to a case where the wafer 126 is carried into the vacuum processing chamber.

When the wafer 126 is transferred to the lock chamber 105, the valve 120 that opens and closes a passage through which the lock chamber 105 and the transfer chamber of the first vacuum transfer chamber 104 communicate with each other is closed, such that the pressure in the lock chamber 105 is raised up to the atmospheric pressure. Thereafter, the valve 120 by which the inside of the casing 106 and the lock chamber 105 are partitioned is opened, such that the inside of the lock chamber 105 communicates with the inside of the casing 106, after which the atmospheric side transfer robot 109 transfers the wafer 126 to an original cassette from the lock chamber 105, and then returns the wafer 126 to an original position in the cassette.

Next, with respect to a front and rear direction (vertical direction in FIG. 1) of the vacuum processing device 100, a flow of an operation in which the gate valves 120 disposed at opposite ends of the vacuum transfer intermediate chamber 111 open and close communication between a space for storing the wafer 126 inside the vacuum transfer intermediate chamber 111 and either the first vacuum transfer chamber 104 or the second vacuum transfer chamber 110 will be described.

In the embodiment, with respect to the front and rear direction of the vacuum processing device 100, the gate valves 120 disposed at opposite ends of the vacuum transfer intermediate chamber 111 are maintained in an open state except the following cases. That is, only when the inert gas is introduced into the vacuum transfer chamber from the purge line 123 that is connected to one vacuum transfer chamber among the plurality of vacuum transfer chambers connected to each other in the front and rear direction with the vacuum transfer intermediate chamber 111 interposed therebetween such as maintenance and includes an opening therein, and the pressure in the vacuum transfer chamber is returned to the atmospheric state, the operation is adjusted so that the gate valve 120 of the vacuum transfer intermediate chamber 111 provided on the side to be opened to the atmosphere is closed.

For example, when the second vacuum transfer chamber 110 is opened to the atmosphere by maintenance, first, the gate valve 120 on the side connected to the vacuum transfer intermediate chamber 111 that is provided in the second vacuum transfer chamber 110 is closed by the command device which is not illustrated. After the fact that the gate valve 120 is closed by the command device, which is not illustrated, is confirmed, the inert gas is introduced from the purge line 123 provided in the second vacuum transfer chamber 110.

Since the vacuum transfer intermediate chamber 111 is not provided with a mechanism for purging or exhausting, while performing the operation of processing the wafer 126, the operation of the gate valves 120 disposed at opposite ends in the front and rear direction of the vacuum transfer intermediate chamber 111 are adjusted so that the gate valves 120 do not put the vacuum transfer intermediate chamber 111 in a closed state at the same time. This is to avoid a state where the pressure in the vacuum transfer intermediate chamber 111 cannot be controlled when both gate valves 120 are in the closed state. That is, for example, when the gate valves disposed at opposite ends of the vacuum transfer intermediate chamber 111 are controlled to be closed, after the wafer 126 is transferred into the vacuum transfer intermediate chamber 111, the operation is adjusted so that one of the gate valves 120 disposed at opposite ends of the vacuum transfer intermediate chamber 111 is closed and the other thereof is opened.

Here, when the pressure value of any of the vacuum processing chambers 103 is relatively higher than the pressure value of the first vacuum transfer chamber 104, the second vacuum transfer chamber 110, and the vacuum transfer intermediate chamber 111, or is equal to or approximate enough to be regarded as the same as the pressure value thereof, there exists a possibility that the atmosphere of the vacuum processing chamber 103 flows out from each vacuum transfer chamber, thereby contaminating the wafer 126 in the process of being transferred or other vacuum processing chambers. When the control part, which is not illustrated, of the vacuum processing device 100 detects that such a condition exists, under the following conditions, the operation of the gate valves 120 provided at both ends of the first vacuum transfer intermediate chamber 111 is adjusted as follows.

For example, in a case when the each wafer 126 is operated to be carried in or out in parallel in the vacuum processing chamber 103 connected to the first vacuum transfer chamber 104, and in the vacuum processing chamber 103 connected to the second vacuum transfer chamber 110, when the control part detects that the first vacuum transfer chamber 104 and the second vacuum transfer chamber 110 communicate with the vacuum processing chambers 103 connected to the respective side walls thereof at the same time, in order to prevent the atmosphere flowing out from the inside of one of the two vacuum processing chambers 103 from flowing into the inside of the other of vacuum processing chambers 103, the operation of at least any one of the gate valve 120 provided at opposite ends of the vacuum transfer intermediate chamber 111 is adjusted to be closed, so that the communication between the first vacuum transfer chamber 104 and the second vacuum transfer chamber 110 via the vacuum transfer intermediate chamber 111 is airtightly closed. On the other hand, when the pressure of the vacuum processing chamber 103 is relatively lower than the pressure inside the vacuum transfer intermediate chamber 111 or that of the other vacuum transfer chamber connected thereto via the vacuum transfer intermediate chamber 111, since particles in the vacuum processing chamber 103 are prevented from flowing out from the vacuum transfer chamber whose side wall is connected to the vacuum processing chamber 103, the gate valves 120 provided at opposite end sides of the vacuum transfer intermediate chamber 111 are adjusted so that a position of an opening degree of the gate valve 120 is maintained in a state where the openings at opposite ends of the vacuum transfer intermediate chamber 111 are opened even while the wafer 126 is carried in or out from the vacuum processing chamber 103.

According to the embodiment, in the vacuum processing device 100 during the operation of processing the wafer 126 as a step of manufacturing a semiconductor device, the pressure of the vacuum processing chamber 103 is adjusted to be relatively lower than the pressure of the first vacuum transfer chamber 104, the second vacuum transfer chamber 110, and the vacuum transfer intermediate chamber 111, based upon the command signal from the control part which is not illustrated. The pressure inside each of the vacuum processing chambers 103 may have a difference in a range within which variations in the processing results of wafers 126 to be respectively performed are allowed. Accordingly, the pressure of the vacuum processing chamber is controlled so as to be lower than the pressure of the first vacuum transfer chamber 104, the second vacuum transfer chamber 110, and the vacuum transfer intermediate chamber 111, thereby making it possible to prevent the gas and the particles of the product in the vacuum processing chamber 103 from flowing out from the vacuum processing chamber 103.

The purge line 123 is provided in each of the first vacuum transfer chamber 104 and the second vacuum transfer chamber 110. Each of the purge lines 123 is provided with a valve which is not illustrated, and the operation thereof is adjusted based upon the command signal from the control part which is not illustrated so as to function both while the wafer 126 is being processed in the vacuum processing chamber 103 and while the wafer 126 is being exposed to the atmosphere.

Further, the first vacuum transfer chamber 104 and the second vacuum transfer chamber 110 are provided with an exhaust line that is provided with an exhaust pipe 122 and a dry pump 121 connected to the exhaust pipe 122. Each exhaust pipe 122 is provided with a valve which is not illustrated, and an operation thereof is adjusted based upon the command signal from the control part which is not illustrated so as to function both while the wafer 126 is being processed and while the wafer 126 is being exposed to the atmosphere.

Next, referring to FIGS. 4 and 5, the operation of the vacuum processing device 100 in the embodiment when the pressure of the vacuum processing chamber 103 is relatively lower than that of the vacuum transfer chamber and the vacuum transfer intermediate chamber 111 will be described. When the pressure inside the vacuum processing chamber 103 is relatively lower than that of the vacuum transfer chamber and the vacuum transfer intermediate chamber 111, the particles in the vacuum processing chamber 103 are prevented from flowing out to another vacuum transfer chamber via the vacuum transfer chamber connected to the side wall of the vacuum processing chamber 103, and the inside of another vacuum processing chamber 103 connected to the aforementioned another vacuum transfer chamber.

In order to achieve such an operation, in the vacuum processing device 100 according to the embodiment, an open state of the gate valves 120 provided at opposite end sides of the vacuum transfer intermediate chamber 111 is maintained while the wafer 126 is being transferred to the inside of the vacuum transfer chamber, and the opening and closing of the plurality of purge lines 123 and exhaust pipes 122 provided in the plurality of vacuum transfer chambers are driven based upon the command signal from the control part so as to form a gas flow suitable for suppressing the occurrence of the contamination depending on an operation state of the vacuum processing device 100. By performing the above-mentioned operation, the efficiency of manufacturing the semiconductor device of the vacuum processing device 100 is improved, such that the processing capacity of the wafer 126 per installation area of the vacuum processing device 100 is improved.

Figure 4:
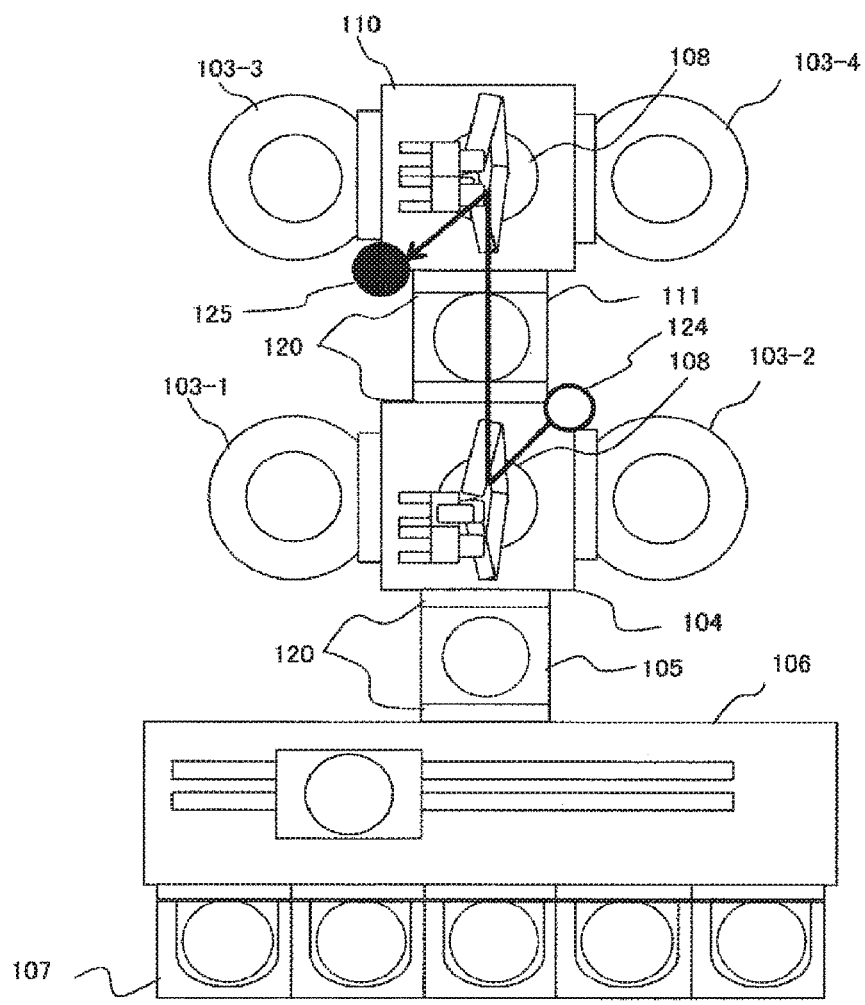
FIG. 4 is a cross sectional view schematically illustrating a flow of a gas inside a vacuum side block of the vacuum processing device according to the embodiment illustrated in FIG. 1.

FIG. 4 illustrates a flow of a gas exhausted from the first vacuum transfer chamber 104 or the second vacuum transfer chamber 110, or a flow of the purge gas supplied to at least any one of the first vacuum transfer chamber 104 and the second vacuum transfer chamber 110 in a state where the respective vacuum transfer robots 108 provided in the first vacuum transfer chamber 104 and the second vacuum transfer chamber 110 perform the transfer operation for processing the wafer 126 in one or a plurality of the vacuum processing chambers 103. FIG. 4 is a cross sectional view schematically illustrating a flow of a gas inside the vacuum side block of the vacuum processing device according to the embodiment illustrated in FIG. 1.

In the vacuum processing device 100 according to the embodiment, the wafer 126 before the processing that is previously determined to be transferred to the vacuum processing chamber 103 connected to the second vacuum transfer chamber 110 and to be processed therein or the wafer 126 transferred after the processing by the vacuum processing device 103 stays inside a storage space of the vacuum transfer intermediate chamber 111, based upon the command signal from the control part which is not illustrated. In the vacuum processing device 100 according to the embodiment, the time for the wafer 126 to stay inside the storage space of the vacuum transfer intermediate chamber 111 is longer than that of other vacuum transfer chambers. The reason is that during the period until the wafer 126 to be processed in the vacuum processing chamber 103 is processed and carried out, the first vacuum transfer robot 108 and the second vacuum transfer robot 108 carries in the wafer 126 before the processing in the vacuum processing chamber 103 connected to the second vacuum transfer chamber 110 or the wafer 126 after the processing therein and then puts the wafer 126 on standby, that is, the time to wait for the transfer of the wafer 126 is generated.

On the other hand, a gas that is formed of particles of a substance having a high reactivity staying in the vicinity of a surface of the processed wafer 126 after the processing in any of the two vacuum processing chambers 103 connected to the side wall surfaces of the second vacuum transfer chamber 110 and particles generated by discharging a product adhering to the surface thereof from the surface stay inside the vacuum transfer intermediate chamber 111. Therefore, it is considered that more substances causing the contamination of other wafers 126 stay in the vacuum transfer intermediate chamber 111 in comparison with the first vacuum transfer chamber 104 and the second vacuum transfer chamber 110.

Further, the volume of the vacuum transfer robot 108 disposed inside the first vacuum transfer chamber 104 or the second vacuum transfer chamber 110 occupies a ratio which cannot be ignored with respect to the volume of the inside of the vacuum transfer chamber. Accordingly, even though it is attempted that the purge gas is supplied to the first vacuum transfer chamber 104 or the second vacuum transfer chamber 110 communicating therewith during the operation when the vacuum transfer robot 108 transfers the wafer 126 so that the particles of the substance causing the contamination are exhausted by the flow of the purge gas flowing therebetween via the vacuum transfer intermediate chamber 111, since the vacuum transfer robot 108 exists in the flow of the purge gas that is introduced into the first vacuum transfer chamber 104 or the second vacuum transfer chamber 110, the flow of the purge gas is inhibited by the movement of an arm of the vacuum transfer robot 108, rotation thereof, and the like when the wafer 126 is transferred. Therefore, the particles of the substance causing the contamination entering from the inside of the vacuum processing chamber 103 or remaining and staying in the vacuum transfer chamber from the surface of the wafer 126 or the vicinity thereof are not efficiently exhausted from the first vacuum transfer chamber 104 or the second vacuum transfer chamber 110.

In order to solve the above-mentioned problem, in the vacuum processing device 100 according to the embodiment, while any of the vacuum transfer robots 108 is in operation, based upon the command signal from the control part, a valve that is disposed on either the right side or left side (right side in the diagram) in a horizontal direction of the opening connected to the first vacuum transfer chamber 104 and carrying in and out the wafer 126 of the vacuum transfer intermediate chamber 111, or disposed on a pipe of the purge line 123 including a gas introduction hole at a position of an inner wall surface of the first vacuum transfer chamber 104 above the opening is opened, whereby the purge line is opened and the purge gas is supplied into the first vacuum transfer chamber 104, whereas a valve that is disposed on the pipe of the purge line 123 provided in the second vacuum transfer chamber 110 is closed, whereby the purge line 123 is closed and the supply of the purge gas to the second vacuum transfer chamber 110 is stopped or reduced. Further, in parallel, an operation is adjusted so that the valve that is disposed on the exhaust pipe 122 provided in the first vacuum transfer chamber 104 is closed such that the exhaust line is closed, whereas a valve that is disposed on either the right side or left side (left side in the diagram) in a horizontal direction of the opening of the vacuum transfer intermediate chamber 111 of the second vacuum transfer chamber 110, or disposed on the exhaust pipe 122 provided at a position of an inner wall surface of the second vacuum transfer chamber 110 below the opening is opened, whereby the exhaust line is opened.

As illustrated by an arrow in FIG. 4, the flow of the purge gas inside the first vacuum transfer chamber 104 and the second vacuum transfer chamber 110, which communicate with each other with the vacuum transfer intermediate chamber 111 interposed therebetween, is configured to be introduced into the first vacuum transfer chamber 104 from the right side when viewed from the front of the vacuum transfer intermediate chamber 111, to flow through the vacuum transfer intermediate chamber, and to flow toward an exhaust port 125 on the left side when the inside of the second vacuum transfer chamber 110 is viewed from the front of the vacuum transfer chamber 111. Such a gas flow becomes a relatively short distance via the vacuum transfer intermediate chamber 111. The gas flow formed as described above actively transfers contaminants such as a foreign substance staying inside the vacuum transfer intermediate chamber 111 while the gas flow is not inhibited by the vacuum transfer robot 108, thereby making it possible to keep the inside of the vacuum transfer intermediate chamber 111 clean.

The first vacuum transfer chamber 104 and the second vacuum transfer chamber 110 according to the embodiment are spaces disposed inside the vacuum vessels including configurations of dimensions, shapes, materials, and the like which are the same as each other or approximate enough to be regarded as the same as each other. Further, two vacuum vessels forming the first vacuum transfer chamber 104 and the second vacuum transfer chamber 110 have planar shapes which can be regarded as a square or a rectangular when viewed from above, and the vacuum processing chamber 103, or the vacuum transfer intermediate chamber 111 or the lock chamber 105 is connected to four side walls corresponding to each side thereof. Accordingly, the gate which is the passage through which the wafer 126 is transferred and passes by allowing the insides thereof to communicate with each other in a state where those are connected to each other is disposed.

Further, the first vacuum transfer chamber 104 and the second vacuum transfer chamber 110 in the aforementioned two vacuum vessels are provided with a gas introduction port 124 communicating with the purge line 123 and the exhaust port 125 communicating with the exhaust pipe 122 at positions that are same as each other or approximate enough to be regarded as substantially the same as each other when viewed from above. Shapes, dimensions, structures, materials, and the like of the respective vacuum transfer robots 108 disposed inside the respective vacuum transfer chambers are also configured to be same as each other or approximate enough to be regarded as substantially the same as each other, and are disposed at a center part of each vacuum transfer vacuum. That is, in the vacuum processing device 100 according to the embodiment, a plurality of vacuum transfer units including the vacuum transfer chamber, the vacuum vessel forming the vacuum transfer chamber, and a structure disposed inside the vacuum transfer robot 108, and the like are configured to achieve the function that performs the same operation or an operation approximate enough to be regarded as the same when replacing one side with the other side, and are connected to each other in the front and rear direction via the vacuum transfer intermediate chamber 111.

That is, the respective first vacuum transfer chamber 104 and second vacuum transfer chamber 110, which have shapes same as each other or approximate enough to be regarded as the same as each other when viewed from above, are provided with the gas introduction port 124 of the purge line 123 or the exhaust port 125 of the exhaust pipe 122 at a position on an inner wall between gates formed on side walls in the upper, lower, right, and left directions in the diagram of the vacuum vessel surrounding the periphery of the vacuum transfer chamber when viewed from above, and gates respectively formed on two side walls adjacent to the side walls. That is, in the embodiment, the gas introduction port 124 of the purge gas or the exhaust port 125 thereof is disposed at a corner or an angle part of the first vacuum transfer chamber 104 and the second vacuum transfer chamber 110. When viewed from above, the position is located outside a region where a space exclusively possessed by a member of the robot is projected from the above by the operation of expanding and contracting the arm by rotating the vacuum transfer robot 108. Therefore, with respect to the flow direction of the gas in the gas introduction port 124 and the exhaust port 125 disposed on the inner walls of the respective vacuum transfer chambers, a distance between the gas introduction port 124 and the exhaust port 125, and the vacuum transfer robot 108 is set to be apart, so that the gas flow at the gas introduction port 124 and the exhaust port 125 is suppressed from being inhibited by the member forming the vacuum transfer robot 108.

In the vacuum processing device 100 according to the embodiment, as illustrated in FIG. 4, the gas introduction port 124 into which the purge gas is introduced from the purge line 123 is disposed on a ceiling surface or an inner wall surface on the right side in the diagram of the gate between the vacuum transfer intermediate chambers 111, or a corner part where both are connected to each other as a corner part of the vacuum transfer chamber at the end of the side wall of the first vacuum transfer chamber 104 to which the vacuum transfer intermediate chamber 111 is connected via the gate valve; and the exhaust port 125 communicating with the exhaust pipe 122 and discharging the particles inside the second vacuum transfer chamber 110 is disposed on a bottom surface or an inner wall surface on the left side in the diagram of the gate between the vacuum transfer intermediate chambers 111, or a corner part where both are connected to each other as a corner part of the vacuum transfer chamber at the end of the side wall of the second vacuum transfer chamber 110 to which the vacuum transfer intermediate chamber 111 is connected via the gate valve. Further, with respect to the rotation axis extending in the vertical direction of the vacuum transfer robot 108 that is disposed at the center part of each of the first vacuum transfer chamber 104 and the second vacuum transfer chamber 110, which has a square shape or a rectangular shape when viewed from above, or a shape approximate enough to be regarded as the same as the square shape or the rectangular shape, one of the gas introduction port 124 and the exhaust port 125 that are disposed at positions of the four corner parts symmetrical with respect to the horizontal axis in the front and rear direction and the left and right direction is positioned above the horizontal axis passing through the center part of a space inside the gate formed at each of the four side walls corresponding to four sides, and the other thereof is positioned therebelow, when viewing the vacuum processing device 100 in the horizontal direction.

In the embodiment, when the flow of the purge gas is formed between the first vacuum transfer chamber 104 and the second vacuum transfer chamber 110 via the vacuum transfer intermediate chamber 111, at least one gas introduction port 124 of one of the first vacuum transfer chamber 104 and the second vacuum transfer chamber 110 is positioned at an upper part where the gate communicating with the vacuum transfer intermediate chamber 111 is interposed therebetween, and the other thereof is position at a lower part. In the example illustrated in FIG. 4, the particles including the purge gas in the first vacuum transfer chamber 104 are configured to be introduced from the above the vacuum transfer intermediate chamber 111, and to flow downward inside the second vacuum transfer chamber 110 via the vacuum transfer intermediate chamber 111. According to the configuration, the particles causing the contamination of the wafer 126 staying in the vacuum side block 102 in which two vacuum transfer chambers are connected to each other via the vacuum transfer intermediate chamber 111 are efficiently discharged to the outside.

Further, the positions of the gas introduction port 124 and the exhaust port 125 are not limited to the configuration described above, and alternatively, the positions thereof can be selected so as to form a gas flow capable of suppressing the contamination thereof. It may not be required to be symmetrically disposed with respect to the center axis of the vacuum transfer robot 108 in the front and rear direction or the left and right direction when viewed from above, and the gas introduction port 124 and the exhaust port 125 may not be disposed at all of the four corners, and may be disposed at less than or more than four places. Further, a combination of the gas introduction port 124 of the second vacuum transfer chamber 110 and the exhaust port 125 of the first vacuum transfer chamber 104 may be used. Further, the gas introduction port 124 may be disposed downward from the center axis of the gate in the height direction, and the exhaust port 125 may be disposed upward therefrom.

Further, in the plurality of vacuum transfer chambers of the vacuum processing device 100 according to the embodiment, as will described later, based upon the command signal from the control part, which is not illustrated, of the vacuum processing device 100, a pair of the gas introduction port 124 and the exhaust port 125 disposed at the upper and lower positions with respect to the center in the height direction of the gate on the inner wall surface of each corner part of the four places when viewed from the vertical direction is selected from a combination of at least two corner parts of each of the two vacuum transfer chambers in a set of the plurality of vacuum transfer chambers communicating with each other via the vacuum transfer intermediate chamber. Further, based upon the command signal from the control part, the operation of purging and exhaust is adjusted so that the purge line 123 communicating with the gas introduction port 124 is opened at one side of the selected corners of each vacuum transfer chamber such that the exhaust line communicating with the exhaust port 125 is closed, and the purge line 123 is closed at the other side thereof so that the exhaust line is opened, thereby forming the flow of the particles including the purge gas between the two vacuum transfer chambers.

On the other hand, as in the vacuum processing device 100 according to the embodiment, in a case where the internal pressure of any of the vacuum processing chambers 103 is relatively lower than that of the vacuum transfer chamber to which the vacuum processing chamber 103 is connected and the vacuum transfer intermediate chamber 111 during the operation of producing the semiconductor device, when the operation of the gate valve 120 that is disposed between the vacuum processing chamber 103 and either the first vacuum transfer chamber 104 or the second vacuum transfer chamber 110 to which the vacuum processing chamber 103 is connected is adjusted by the signal from the control part and the gate is opened while the wafer 126 is transferred between the vacuum processing chamber 103 and the vacuum transfer chambers, there exists a possibility that the particles of the purge gas introduced from the purge line 123 of the first vacuum transfer chamber 104 may be attracted to the inside of the vacuum processing chamber 103 and enter thereinto. In this case, while the vacuum transfer robot 108 performs the operation of transferring the wafer 126, there exists a possibility that the flow caused by the purge gas is not formed with sufficient strength in the vacuum transfer intermediate chamber 111, such that the substance causing the contamination of the wafer 126 may stay therein.

In the embodiment, as described above, the selection of the purge line 123 and the exhaust line and the opening and closing thereof are adjusted by the command signal from the control unit so that the gas introduction port 124 provided at the upper right corner in the diagram of the first vacuum transfer chamber 104 and the exhaust port 125 provided at the lower left corner in the diagram of the second vacuum transfer chamber 110 and communicating with the exhaust pipe 122 are opened. In this state, the first vacuum transfer chamber 104, the second vacuum transfer chamber 110, and the vacuum transfer intermediate chamber 111 disposed therebetween communicate with each other by the connection of the vacuum vessels forming the first vacuum transfer chamber 104, the second vacuum transfer chamber 110, and the vacuum transfer intermediate chamber 111, and one space is sealed as one vacuum transfer unit and is airtightly partitioned from the outside. Accordingly, the gas flow between the front and rear vacuum transfer chambers via the vacuum transfer intermediate chamber 111 is formed, thereby suppressing the occurrence of a so-called shortcut in which a flow between the inside of one vacuum transfer chamber and the vacuum processing chamber 103 connected to the side wall thereof is closed.

Further, in the example described above, the purge gas is configured to be introduced from only one opened place of the gas introduction ports 124 at four corner parts communicating with the purge line 123 provided in the first vacuum transfer chamber 104, however, alternatively, the operation may be adjusted so that the purge gas is introduced at the same time or in parallel from two places where the gas introduction port 124 disposed closer to the gate of the vacuum transfer intermediate chamber 111 among other gas introduction ports 124 is added. In this case, since the gas flow rate passing through the inside of the vacuum transfer intermediate chamber 111 becomes large, it is possible to improve the effect of discharging the particles generating the internal contamination by allowing the particles to be included in the flow of the purge gas.

Next, referring to FIG. 5, in the vacuum processing device 100 according to the embodiment, a gas flow inside the vacuum side block 102 when each of vacuum transfer robots 108 provided in the first vacuum transfer chamber 104 and the second vacuum transfer chamber 110 do not perform the transfer operation of the wafer 126 (hereinafter referred to as an idle state) will be described. FIG. 5 is a cross sectional view schematically illustrating the gas flow inside the vacuum side block of the vacuum processing device according to the embodiment illustrated in FIG. 1.

In the embodiment, in a case where the vacuum transfer robot 108 becomes in the idle state, before starting the processing of another lot of the wafer 126 after completing the processing of a set of the number of the wafers 126 (hereinafter referred to as a lot) to be processed inside the vacuum processing chamber 103 under substantially the same condition stored inside at least one cassette placed on the cassette 107, when the wafers 126 are not processed inside all of the plurality of vacuum processing chambers 103 and the transfer of the wafers 126 by the vacuum transfer robot 108 is not required, a period during which the control part can make a determination is considered.

In this example, a fact that the vacuum transfer robot 108 does not perform the operation such as the rotation and the expansion and contraction of the arm for transferring the wafer 126, and the purge gas is introduced by the operation such that the gas flow is formed inside the vacuum transfer chamber where the vacuum transfer robot 108 is disposed, or the action in which the formed gas flow transfers the particles inside the vacuum transfer chamber on the flow is inhibited is considered to be relatively suppressed in comparison with the case in FIG. 4. Further, since the gate valve 120 does not perform the operation of the opening and closing, a fact that the purge gas and the particles introduced into the vacuum transfer chamber 103 and the vacuum processing chamber are drawn into the vacuum processing chamber is reduced.

In the embodiment, when the control part receiving the signal from a detector installed in the vacuum transfer robot 108 detects that the operation of transferring the wafer 126 by the vacuum transfer robot 108 is not performed, or when the control part detects a time period during which the transfer is not performed from a predetermined operation schedule of the vacuum processing device 100, the control part transmits the command signal so that a valve on any of the purge lines 123 connected to the first vacuum transfer chamber 104 is closed, and a valve on at least one of the purge lines 123 connected to the second vacuum transfer chamber 110 is opened. Further, the control part transmits the command signal so that a valve on at least any of the exhaust pipes 122 provided in the first vacuum transfer chamber 104 is opened, and a valve on any of the exhaust pipes 122 provided in the second vacuum transfer chamber 110 is closed.

Figure 5:
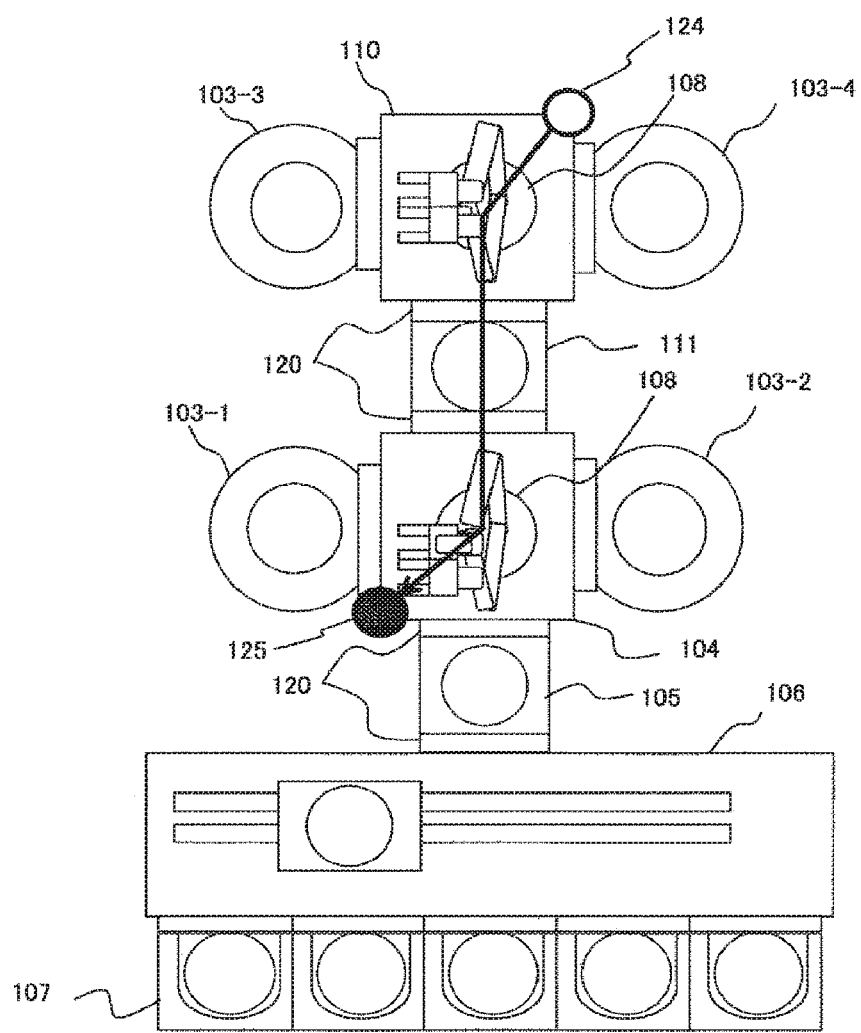
FIG. 5 is a cross sectional view schematically illustrating a flow of a gas inside a vacuum side block of the vacuum processing device according to the embodiment illustrated in FIG. 1.

In the example illustrated in FIG. 5, in the first vacuum transfer chamber 104, the valve on the exhaust pipe 122 communicating with the exhaust port 125 disposed at a corner part on the left side (left lower side in the diagram) when viewed from the front with respect to a side wall to which the lock chamber 105 is connected via the gate valve 120 is opened, and the valves on the exhaust pipes 122 communicating with the exhaust ports 125 disposed at three other corner parts are closed. Further, in the second vacuum transfer chamber 110, the valve on the purge line 123 communicating with the gas introduction port 124 disposed at a corner part on the right side (upper right side in the diagram) when viewed from the front with respect to a wide wall (the inner most side wall) at a position opposite to a side wall to which the vacuum transfer intermediate chamber 111 is connected via the gate valve 120 is opened, and the valves on the purge lines 123 communicating with the gas introduction ports 124 at three other corner parts are closed. In this state, the vacuum vessel that is formed by connecting the first vacuum transfer chamber 104, the second vacuum transfer chamber 110, and the vacuum transfer intermediate chamber 111 disposed therebetween airtightly partitions one sealed space inside and outside.

As indicated by an arrow schematically illustrated in FIG. 5, the gas in the vacuum processing device 100 according to the embodiment in a state where the opening and closing of the purge line 123 and the exhaust pipe 122 are selected flows from the innermost gas introduction part 124 up to the exhaust port 125 closest to the front side via the vacuum transfer intermediate chamber 111 among the combinations of the intake and exhaust of the purge gas by the gas introduction port 124 and the exhaust port 125 that are opened in the space inside the vacuum transfer unit with respect to the front and rear direction of the vacuum processing device 100, that is, flows through a so-called the longest distance. The arrow illustrated in the diagram schematically represents the gas flow, and the gas flow or the particles does not exactly flow along the line in the diagram, but the flow is formed inside the first vacuum transfer chamber 104, the second vacuum transfer chamber 110, and the vacuum transfer intermediate chamber 111 through a space of a gap between the upper and lower parts of each of the stationary vacuum transfer robots 108 and the inner side walls of the periphery thereof. Particularly, the gas flow is formed at the corner part where the gas introduction port 124 that does not communicate with the opened purge line 123 of the first vacuum transfer chamber 104 and the second vacuum transfer chamber 110 and does not introduce the purge gas or the exhaust port 125 that does not communicate with the opened exhaust pipe 122 and does not perform the exhausting is disposed and the gap. By using the flow described above, the particles of the substance causing the contamination staying in the gap can be actively transferred and discharged through the gas flow.

In the example illustrated in FIG. 5, the exhaust pipe 122 communicating with the exhaust port 125 that is positioned on the left lower side in the diagram and provided in the first vacuum transfer chamber 104 and the purge line 123 communicating with the gas introduction port 124 positioned at the corner part on the upper right side in the diagram and provided in the second vacuum transfer chamber 110 are opened, such that the gas flow is formed therebetween. The present invention is not limited thereto. Alternatively, in the present invention, the purge line 123 and the exhaust pipe 122 capable of forming the gas flow capable of effectively discharging the substance causing the contamination may be selected during the period when the operation of the vacuum transfer robots 108 inside each of the plurality of vacuum transfer chambers is stopped. That is, the gas flow from the first vacuum transfer chamber 104 to the second vacuum transfer chamber 110 may be formed.

Further, in the example described above, the purge gas is configured to be introduced from only one opened place of the gas introduction ports 124 at four corner parts communicating with the purge line 123 provided in the first vacuum transfer chamber 104, however, alternatively, the operation may be adjusted so that the purge gas is introduced at the same time or in parallel from two places where the gas introduction port 124 disposed at a place closer to the gate of the vacuum transfer intermediate chamber 111 among other gas introduction ports 124 is added. In this case, since the gas flow rate passing through the inside of the vacuum transfer intermediate chamber 111 becomes large, it is possible to improve the effect of discharging the particles generating the internal contamination by allowing the particles to be included in the flow of the purge gas.

The example of the gas flow illustrated in FIG. 4 and the example illustrated in FIG. 5 are performed by being switched by the command signal from the control part which is not illustrated by the following two patterns. The first pattern is a case where the vacuum transfer robot 108 can be switched to the idle state before the inside of the vacuum transfer intermediate chamber 111 is required to be cleaned. In this pattern, before the inside of the vacuum transfer intermediate chamber 111 is required to be cleaned, when the control part detects that a predetermined cumulative processing time or the number of the processed wafers 126 which serves as a reference for performing maintenance and inspection of cleaning, and the like of the arbitrary vacuum processing unit 103 has reached, the vacuum transfer robot becomes in the idle state by the command signal from the control part, the selection of the purge gas line 123 and the exhaust pipe 122 provided in the first vacuum transfer chamber 104 and the second vacuum transfer chamber 110 is switched, and then the pattern of the flow of particles formed by the introduction and the exhaust of the purge gas into and from the inside of the vacuum vessel of the vacuum side block 102 formed by the first vacuum transfer chamber 104, the second vacuum transfer chamber 110, and the vacuum transfer intermediate chamber 111 is switched from the state where the vacuum transfer robot 108 is in operation as illustrated in FIG. 4 to the idle state as illustrated in FIG. 5.

The second pattern includes a case in which the contamination does not reach a predetermined limit of contamination to clean the inside of the vacuum transfer intermediate chamber 111, and the operation of the vacuum processing device 100 or the processing of the wafer 126 is scheduled to continue. This is a state in which a fact that a value of a parameter, which is set by a user in advance, (for example, density, adhesion or amount of deposition) indicating an amount of the contamination for cleaning the vacuum transfer intermediate chamber 111 or an amount of the substance causing the contamination does not reach the limit is detected by the control part, and even though any of the vacuum processing unit 103 reaches the predetermined cumulative processing time or the number of the processed wafers 126, the operation for manufacturing the semiconductor device based upon processing of the wafer continues until all of the unprocessed wafers 126 stored inside the cassette placed on the cassette table 107 are processed by any of the vacuum processing chambers 103, after which the selection of the purge line 123 and the exhaust pipe 122 in the vacuum side block 102 and the flow pattern formed by the selection thereof are switched from the state illustrated in FIG. 4 to the state illustrated in FIG. 5 based upon the command signal from the control part, thereby continuing for a predetermined time.

The control part determines whether or not the cumulative processing time of the vacuum processing unit 103 set in advance by the user or the number of the wafers 126 is reached before starting the processing of the wafers 126 in another cassette after the processing of all the wafers 126 stored inside the respective cassettes placed on the cassette table 107 is completed. When it is determined that the cumulative processing time thereof or the number of the wafers 126 is reached by the control part, before the processing of the wafer 126 in another cassette is started, the selection of the purge line 123 and the exhaust pipe 122 in the vacuum side block 102 and the flow pattern by the selection thereof are switched from the state illustrated in FIG. 4 to the state illustrated in FIG. 5, thereby continuing for the predetermined time.

Figure 6:
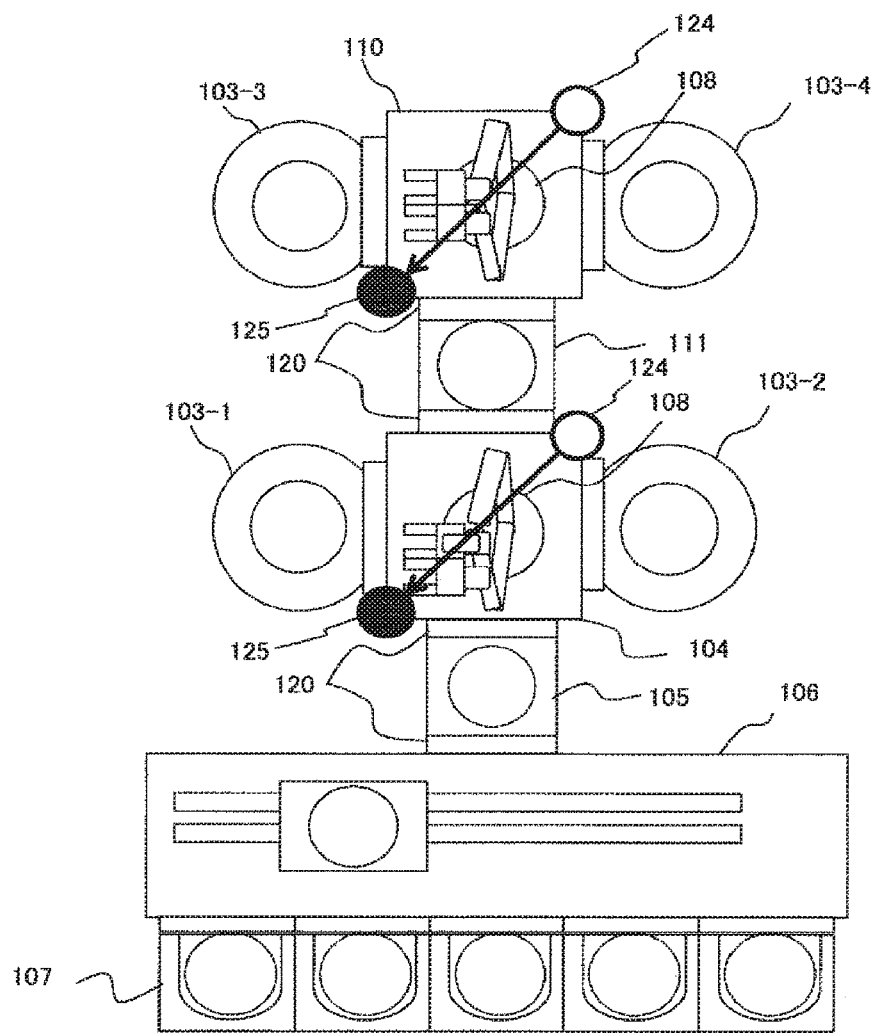
FIG. 6 is a diagram schematically illustrating a flow of another gas by exhaust of a gas and introduction of a purge gas inside a vacuum vessel of a vacuum side block 102 of a vacuum processing device 100 according to the embodiment of the present invention.

FIG. 6 is a diagram schematically illustrating a flow of another gas by exhaust of the gas and introduction of the purge gas inside the vacuum vessel of the vacuum side block 102 of the vacuum processing device 100 according to the embodiment of the present invention. In the example illustrated in FIG. 6, with respect to the exhaust of the gas and the introduction of the purge gas inside the vacuum vessel of the vacuum side block 102, the purge line 123 and the exhaust pipe 122 in the vacuum side block 102 are selected by the control part, and the valve on each of the purge line 123 and the exhaust pipe 122 provided in each of the first vacuum transfer chamber 104 and the second vacuum transfer chamber 110 is opened, after which, as a result, the particles moves from the gas introduction port 124 into which the purge gas is introduced in each of the first vacuum transfer chamber 104 and the second vacuum transfer chamber 110 toward the exhaust port 125 positioned on the side opposite to the gas introduction port 124 with the vacuum transfer robot 108 interposed therebetween, thereby forming the exhaust flow.

When the flow pattern of FIG. 6 is formed while the vacuum transfer robot 108 is in operation, and the purge line 123 and the exhaust pipe 122 are selected by the control part so as to form the pattern illustrated in FIG. 5 in the idle state, in the pattern illustrated in FIG. 6, the gas flow inside each of the vacuum transfer chambers is inhibited by the vacuum transfer robot 108 and further, it becomes difficult to generate an active gas flow inside the vacuum transfer intermediate chamber 111.

Further, even when the gas flow illustrated in FIG. 6 is formed in the idle state and the flow of the pattern illustrated in FIG. 4 is formed while the vacuum transfer robot 108 is in operation, the substance causing the occurrence of contamination inside the vacuum transfer intermediate chamber 111 continues to stay therein. Therefore, it is required to clean the vacuum transfer intermediate chamber 111 in a short period of time, thereby reducing the productivity of the device. Therefore, in the embodiment, the purge line 123 and the exhaust pipe 122 are selected by the command signal from the control part in the state where the vacuum transfer robot 108 is in the idle state, and the gas flow illustrated in FIG. 5 is formed only for a predetermined period for each period of a plurality of idle states, or formation of the gas flow illustrated in FIG. 5 is repeated for a predetermined period during one idle state.

Figure 7:
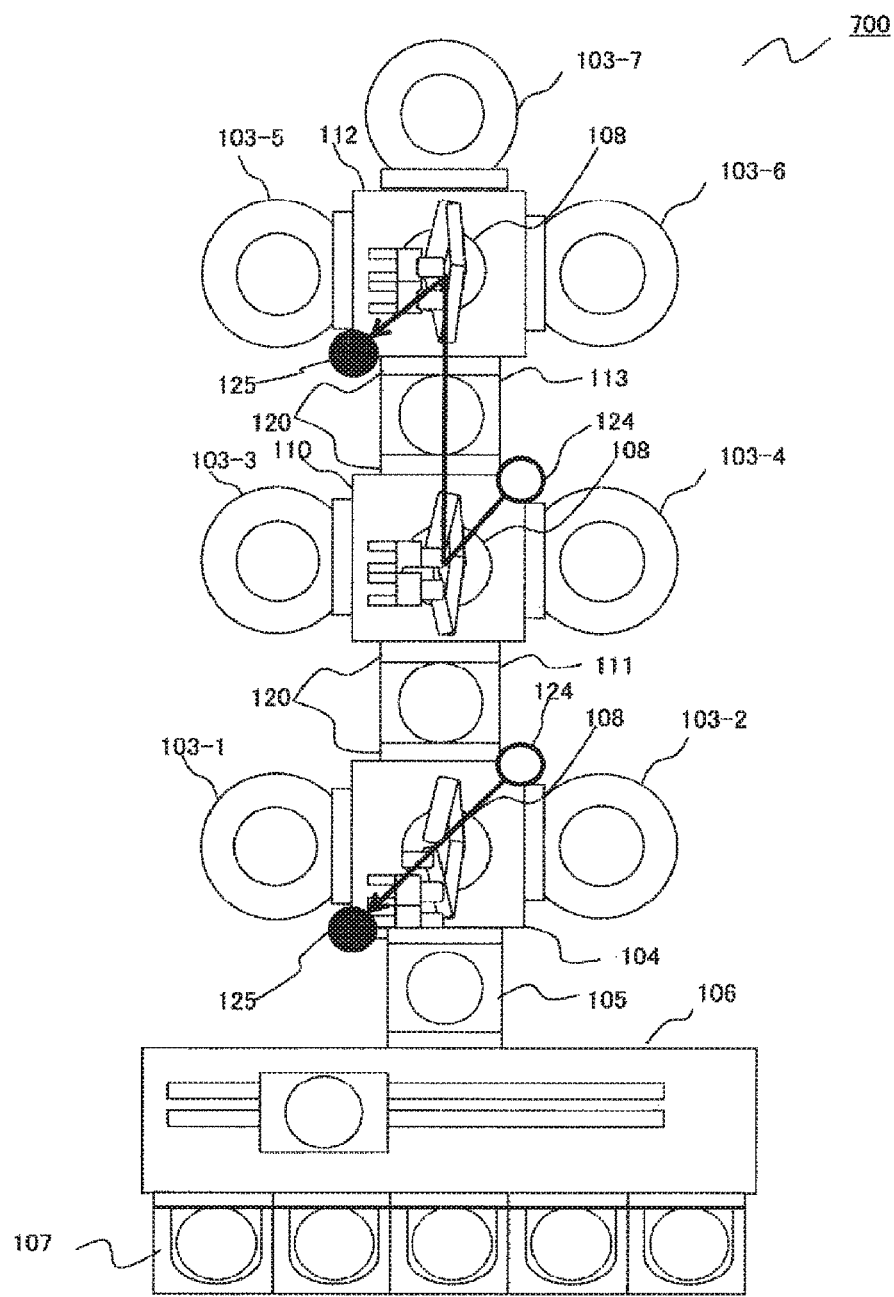
FIG. 7 is a cross sectional view schematically illustrating an outline of a configuration of a vacuum processing device according to a modification of the embodiment of the present invention illustrated in FIG. 1.

FIGS. 7 to 10 illustrate modifications of the embodiment illustrated in FIG. 1. FIGS. 7 to 10 illustrate a vacuum processing device 700 in which a third vacuum transfer chamber 112 is connected via a second vacuum transfer intermediate chamber 113 with respect to the example illustrated in FIGS. 1 to 3. As illustrated in FIG. 7, the third vacuum transfer chamber 112 can be connected to a third vacuum transfer intermediate chamber and the vacuum transfer processing chamber 103, which is not illustrated, at a position facing the second vacuum transfer intermediate chamber 113, however, the third vacuum transfer chamber 112 respectively has no functional difference and no difference in a device configuration in comparison with the first vacuum transfer chamber 104, the second vacuum transfer chamber 110, and the vacuum transfer intermediate chamber 111.

Figure 8:
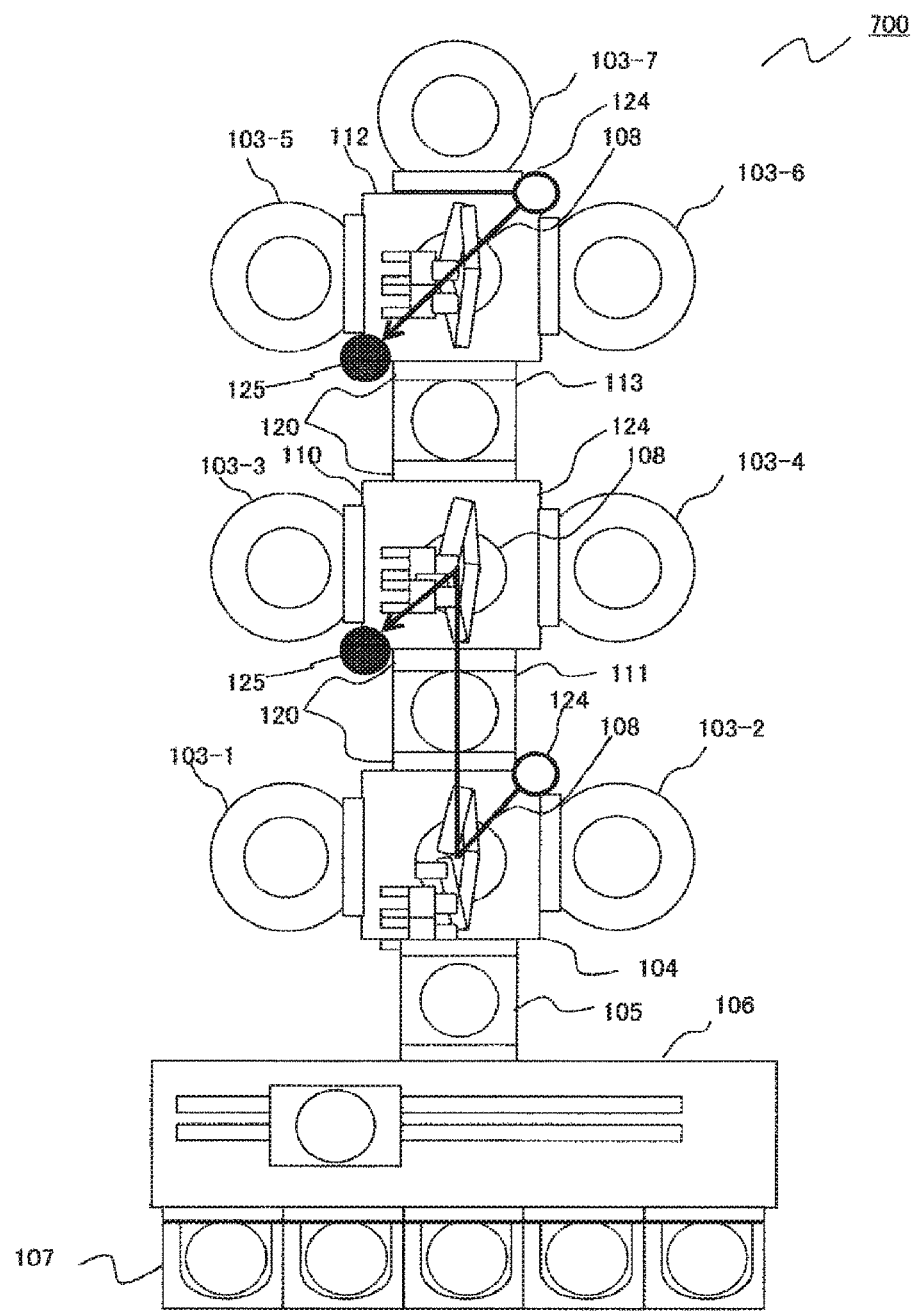
FIG. 8 is a cross sectional view schematically illustrating an outline of a configuration of a vacuum processing device according to a modification of the embodiment of the present invention illustrated in FIG. 1.
Figure 9:
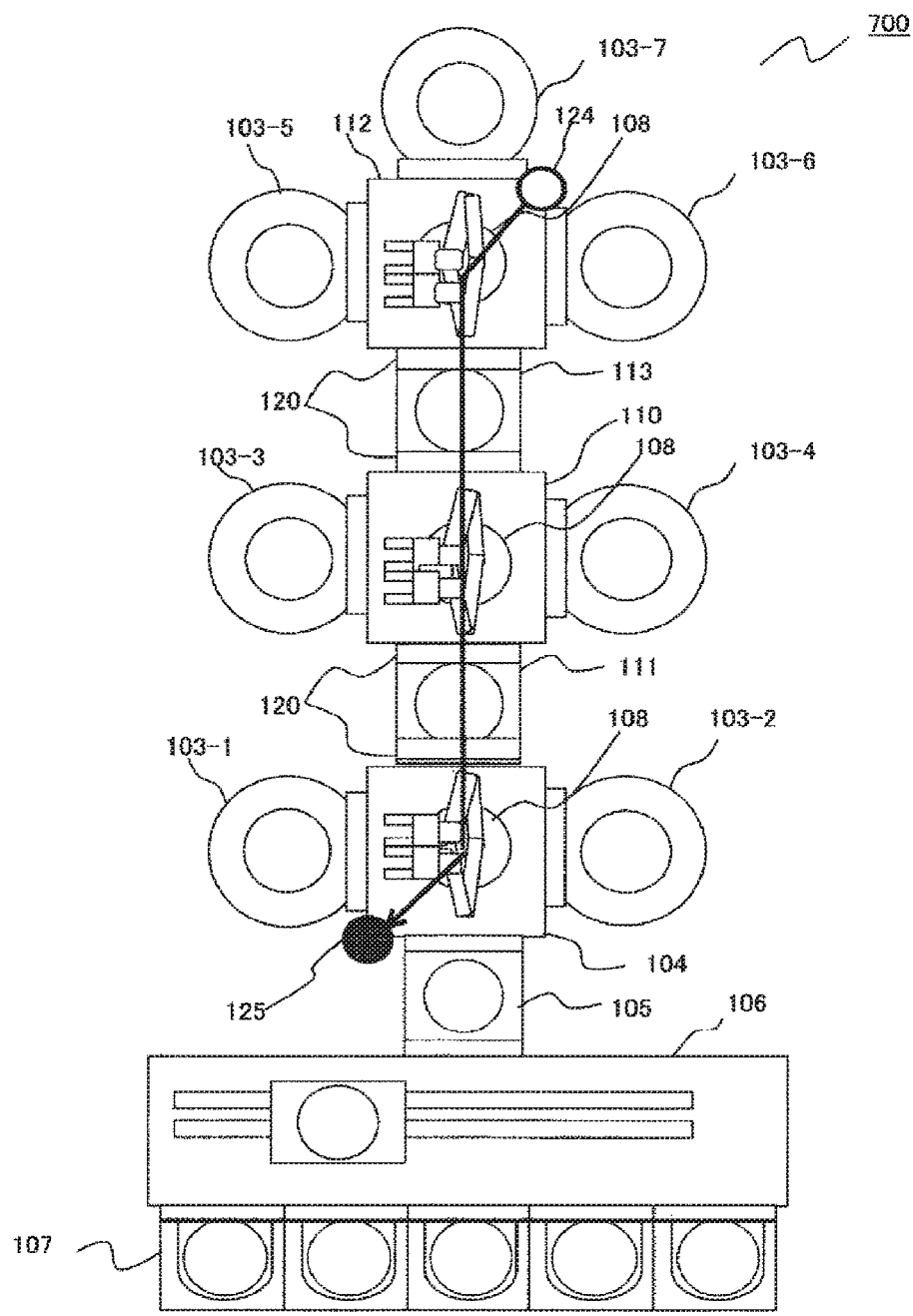
FIG. 9 is a cross sectional view schematically illustrating an outline of a configuration of a vacuum processing device according to a modification of the embodiment of the present invention illustrated in FIG. 1.
Figure 10:
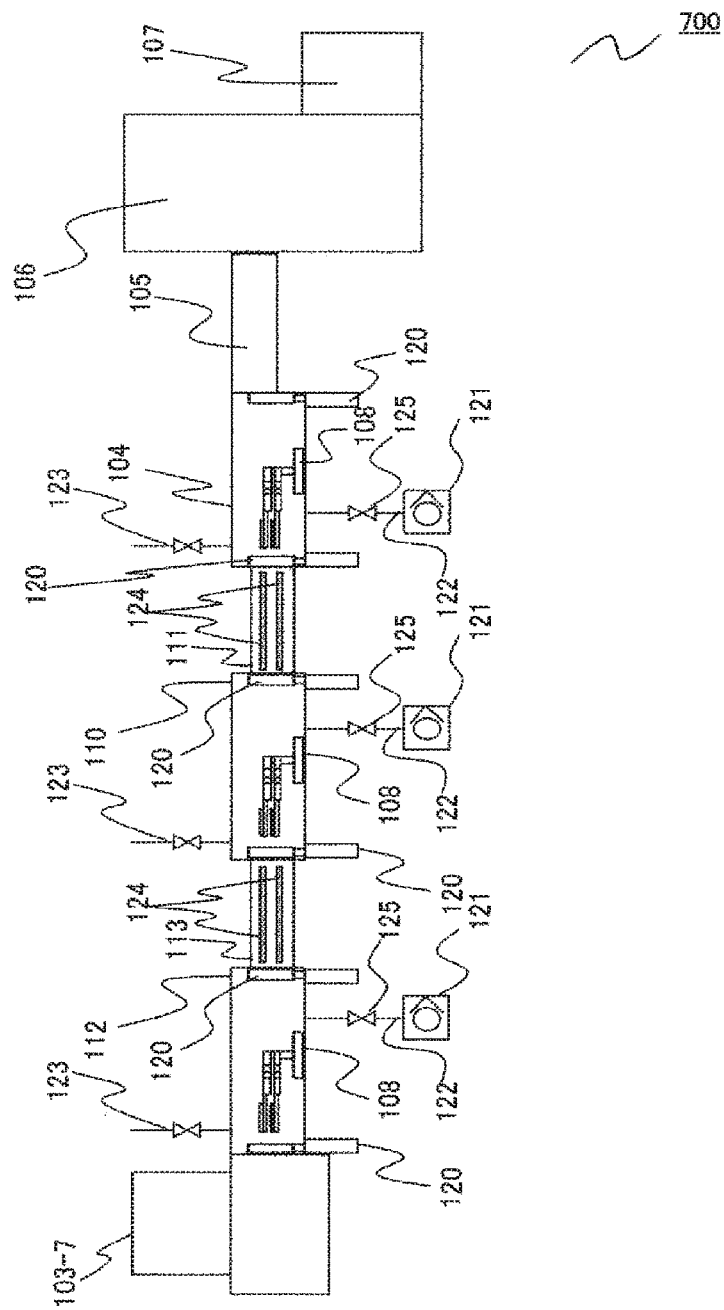
FIG. 10 is a longitudinal sectional view illustrating an outline of a configuration of the vacuum processing device according to the modification of the embodiment of the present invention illustrated in FIG. 7.

FIG. 10 is a longitudinal sectional view illustrating an outline of a configuration of the vacuum processing device according to the modifications illustrated in FIGS. 7 to 9. In the vacuum processing device 700 according to the modification illustrated in the drawing, only one vacuum processing chamber 103 is illustrated in the third vacuum transfer chamber 112. Further, the wafer 126 is held at a position vertically offset on a support table of the wafer 126 which is not illustrated inside the vacuum transfer intermediate chamber 111. Further, two vacuum processing chambers 103 are connected to the first vacuum transfer chamber 104.

Further, the second vacuum transfer intermediate chamber 113 and the third vacuum transfer chamber 112 have no substantial difference with respect to the configuration and the function to be performed in comparison with other vacuum transfer vessels forming the vacuum processing device 700. When the pressure inside the arbitrary vacuum processing chamber 103 is relatively lower than that of the vacuum transfer chamber and the vacuum transfer intermediate chamber, the particles such as a gas and a product inside the vacuum processing chamber 103 are prevented from flowing out from the vacuum transfer chamber communicating with the vacuum processing chamber 103 via the gate valve 120, and when the gate valves 120 provided at opposite ends of the first vacuum transfer intermediate chamber 111 are controlled to maintain the open state while the wafer 126 is being transferred, the opening and closing of each of the plurality of purge lines 123 and exhaust pipes 122 of the vacuum transfer chambers provided in the device will be described in which the most suitable gas flow is formed inside the vacuum vessel that is formed by three vacuum transfer chambers and the vacuum transfer intermediate chambers connected therebetween in consideration of a plurality of situations where the device is placed.

FIGS. 7 and 8 are cross sectional views schematically illustrating the outline of the configuration of the vacuum processing device according to the modification of the present invention illustrated in FIG. 1. As in FIG. 3, FIGS. 7 and 8 also illustrate the upper and lower parts of the vacuum processing device 700 in the front and rear direction when viewed from above. Even in this example, in the same manner as the embodiment in FIG. 3, the insides of the first vacuum transfer intermediate chamber 111 and the second vacuum transfer intermediate chamber 113 are place where a gas or a product having reactivity which is brought in by the wafer 126 after being processed in the vacuum processing chamber 103 or highly attached particles, and the particles of the substance causing the contamination of the wafer 126 before processing of particles, and the like by the gas discharged from the wafer 126 after the processing are easy to stay, such that the contamination of the wafer 126 is easy to occur in comparison with the vacuum transfer chamber. Further, in the same manner as that of the above-mentioned embodiment, the volume of the vacuum transfer robot 108 in each vacuum transfer chamber occupies a ratio that cannot be ignored with respect to the volume of the inside of the vacuum transfer chamber, and while performing the operation of transferring the wafer 126, the flow of the purge gas that is supplied from the purge gas line 123 provided in each of the vacuum transfer chambers to the inside thereof is inhibited by the operation.

Also, in this example, the opening and closing of the valves disposed on the purge line 123 and the exhaust pipe 122 provided in the first vacuum transfer chamber 104, the second vacuum transfer chamber 110, and the third vacuum transfer chamber 112 are selected and operated according to the command signal transmitted from the control part. As a result, in the example illustrated in FIG. 7 of the modification, based upon the command signal from the control part, the valves disposed on the purge line 123 provided in the first vacuum transfer chamber 104 and the second vacuum transfer chamber 110 are opened, and the valve disposed on the purge line 123 provided in the third vacuum transfer chamber 112 is closed. Further, the valves disposed on the exhaust pipe 122 provided in the first vacuum transfer chamber 104 and the third vacuum transfer chamber 112 are opened, and the valve disposed on the exhaust pipe 122 provided in the second vacuum transfer chamber 110 is closed.

In the example illustrated in FIG. 7, in the first vacuum transfer chamber 104, the valve on the purge gas line 123 communicating with a gas supply port disposed at a corner part on the right side in the horizontal direction (corner part on the right rear side in the diagram) when viewed from the front of the side wall connected to the vacuum transfer intermediate chamber 111 via the gate valve 120 is opened, and at the same time, the valve on the exhaust pipe 122 communicating with the exhaust port 125 disposed at a corner part on the left side in the horizontal direction (corner part on the left front side in the diagram) when viewed from the front of the side wall connected to the lock chamber 105 via the gate valve 120 is opened. Further, the valves on the exhaust pipe 122 communicating with exhaust port 125 and on the purge gas line 123 communicating with the gas introduction port 124 disposed at other corners are closed.

Further, in the second vacuum transfer chamber 110, the valve on the purge gas line 123 communicating with a gas supply port disposed at a corner part on the right side in the horizontal direction (corner part on the right rear side in the diagram) when viewed from the front of the side wall connected to the vacuum transfer intermediate chamber 113 via the gate valve 120 is opened, and at the same time, the valve on the exhaust pipe 122 communicating with the exhaust port 125 disposed at a corner part on the left side in the horizontal direction (corner part on the left front side in the diagram) when viewed from the front of the side wall connected to the lock chamber 105 via the gate valve 120 is opened. Further, the valves on the exhaust pipe 122 communicating with the purge gas line 123 and the exhaust port 125 communicating with the gas introduction port 124 disposed at other corners of the second vacuum transfer chamber 110 and the third vacuum transfer chamber 112 are closed.

As indicated by an arrow illustrated in the diagram, the purge gas of the vacuum processing device 700 in which the opening and closing of the purge line 123 and the exhaust pipe 122 are selected flows from the gas supply port of the purge line 123 opened inside the first vacuum transfer chamber 104 into the first vacuum transfer chamber 104, and then flows toward the exhaust port 125 communicating with the exhaust pipe 122 disposed on the opposite side with the vacuum transfer robot 108 interposed therebetween, thereby being discharged. On the other hand, in the second vacuum transfer chamber 110 and the third vacuum transfer chamber 112, the purge gas is configured to be introduced into the second vacuum transfer chamber 110 from the right side when viewed from the front of the vacuum transfer intermediate chamber 113, to flow through the vacuum transfer intermediate chamber 113, and to flow through the inside of the third vacuum transfer chamber 112 toward the exhaust port 125 on the left side when viewed from the front of the vacuum transfer intermediate chamber 112. In this case, in the first vacuum transfer chamber 104, when the vacuum transfer robot 108 performs the operation of transferring the wafer 126, the flow of the gas is inhibited, such that the action of effectively transferring the substance causing the occurrence of the contamination staying in the first vacuum transfer chamber 104 is impaired. Further, it becomes difficult to form the gas flow inside the first vacuum transfer intermediate chamber 111, such that the substance causing the contamination stays inside the first vacuum transfer intermediate chamber 111.

On the other hand, in the example illustrated in FIG. 8, the valves on the purge line 123 provided in the first vacuum transfer chamber 104 and the third vacuum transfer chamber 112 are opened, and the valve on the purge line 123 provided in the second vacuum transfer chamber 110 is closed. Further, the valves on the exhaust pipe 122 provided in the second vacuum transfer chamber 110 and the third vacuum transfer chamber 112 are opened, and the valve on the exhaust pipe 122 provided in the first vacuum transfer chamber 104 is closed.

In the example illustrated in FIG. 8, in the third vacuum transfer chamber 112, the valve on the purge gas line 123 communicating with a gas supply port disposed at a corner part on the right side in the horizontal direction (corner part on the right rear side in the diagram) when viewed from the front of the side wall connected to the innermost vacuum transfer intermediate chamber 103 of the vacuum processing device 700 via the gate valve 120 is opened, and at the same time, the valve on the exhaust pipe 122 communicating with the exhaust port 125 disposed at a corner part on the left side in the horizontal direction (corner part on the left front side in the diagram) when viewed from the front of the side wall connected to the vacuum transfer intermediate chamber 113 via the gate valve 120 is opened. Further, the valves on the exhaust pipe 122 communicating with the purge gas line 123 and the exhaust port 125 communicating with the gas introduction port 124 disposed at other corners are closed.

Further, in the first vacuum transfer chamber 104, the valve on the purge gas line 123 communicating with a gas supply port disposed at a corner part on the right side in the horizontal direction (corner part on the right rear side in the diagram) when viewed from the front of the side wall connected to the vacuum transfer intermediate chamber 111 via the gate valve 120 is opened, and at the same time, the valve on the exhaust pipe 122 communicating with the exhaust port 125 disposed at a corner part on the left side in the horizontal direction (corner part on the left front side in the diagram) when viewed from the front of the side wall connected to the vacuum transfer intermediate chamber 111 via the gate valve 120 is opened. Further, the valves on the exhaust pipe 122 communicating with the purge gas line 123 and the exhaust port 125 communicating with the gas introduction port 124 disposed at other corners of the second vacuum transfer chamber 110 and the third vacuum transfer chamber 112 are closed.

As indicated by an arrow illustrated in the diagram, the purge gas of the vacuum processing device 700 in which the opening and closing of the purge line 123 and the exhaust pipe 122 are selected flows from the gas supply port of the purge line 123 opened inside the third vacuum transfer chamber 112 into the third vacuum transfer chamber 112, and then flows toward the exhaust port 125 communicating with the exhaust pipe 122 disposed on the opposite side with the vacuum transfer robot 108 interposed therebetween, thereby being discharged. On the other hand, in the first vacuum transfer chamber 104 and the second vacuum transfer chamber 110, the purge gas is configured to be introduced into the first vacuum transfer chamber 104 from the right side when viewed from the front of the vacuum transfer intermediate chamber 111, to flow through the vacuum transfer intermediate chamber 111, and to flow through the inside of the second vacuum transfer chamber 110 toward the exhaust port 125 on the left side when viewed from the front of the vacuum transfer intermediate chamber 111.

In this case, in the third vacuum transfer chamber 112, when the vacuum transfer robot 108 performs the transfer operation, the gas flow is inhibited such that contaminants staying inside the third vacuum transfer chamber 112 cannot be effectively transferred. Further, the gas flow cannot be formed in the second vacuum transfer intermediate chamber 113, such that the contaminants stay inside the second vacuum transfer intermediate chamber 113.

Then, the vacuum processing device 700 in the example performs the following operation based upon the command signal from the control part. That is, based upon the information of a predetermined schedule, with respect to an arbitrary set of sheets of the wafers 126, until half the time of the time required from the start of the operation of processing a first sheet of the set of the wafers 126 to the processing of the last sheet of wafer 126 is reached, each valve of the purge line 123 and the exhaust pipe 122 provided in the first vacuum transfer chamber 104, the second vacuum transfer chamber 110, and the third vacuum transfer chamber 112 of the vacuum side block 102 and the opening and closing thereof are selected in order to ensure the gas flow illustrated in FIG. 7. Next, after the control part detects that the half time is reached, each valve of the purge line 123 and the exhaust pipe 122 and the opening and closing thereof are selected so as to ensure the gas flow illustrated in FIG. 8 until the last sheet of wafer 126 is processed. Further, the gas flows in FIGS. 7 and 8 may be switched at every quarter of the time without being limited to the above-mentioned half the time, and the flow selected at first may be any of the flows illustrated in FIGS. 7 and 8.

By performing the aforementioned operation, the substance causing the occurrence of the contamination staying in the plurality of vacuum transfer chambers and the vacuum transfer intermediate chambers during the operation state can be actively transferred and discharged, thereby making it possible to keep the inside of the first vacuum transfer intermediate chamber 111 and the second vacuum transfer intermediate chamber 113 clean. Further, in the same manner as the embodiment of FIG. 3, the flow of the particles by the gas may be formed inside the vacuum transfer intermediate chamber from the gas introduction port 124 communicating with the plurality of purge lines 123, and the purge line 123, which is provided in the vacuum transfer chamber, controlled to be opened by the command device is controlled to be opened only at one place per vacuum transfer chamber, however, alternatively, when the purge line 123 is also provided on a surface of the vacuum transfer chamber which faces a surface on which the purge line 123 is provided and is close to the vacuum transfer intermediate chamber, the purge line 123 may be controlled to simultaneously open two places.

On the other hand, the gas is controlled to flow directly from the purge line 123 provided in one certain vacuum transfer chamber to the exhaust pipe 122 provided in the same vacuum transfer chamber, that is, in the case of the first vacuum transfer chamber 104 in FIG. 7, when the purge gas is introduced from a plurality of places, there exists a possibility that the gas flow is inhibited by the vacuum transfer robot 108, and also the gas collides with each other inside the vacuum transfer chamber, thereby generating a turbulent flow. The turbulent flow is not preferable because the turbulent flow not only prevents the transfer of the substance causing the contamination, but also promotes attaching the substance to the wafer 126 by winding the substance staying therein, thereby reducing processing yield.

Next, FIGS. 7 and 8 illustrate a gas flow in the vacuum side block 102 during the operation in which the semiconductor device is manufactured and at least one vacuum transfer robot 108 is being operated. FIG. 9 illustrates a gas flow formed in the vacuum side block 102 when any of the vacuum transfer robots is in the idle state. FIG. 9 is a cross sectional view schematically illustrating an outline of a configuration of a vacuum processing device according to a modification of the embodiment of the present invention illustrated in FIG. 1.

In the configuration illustrated in FIG. 9, since any of the vacuum transfer robots 108 does not perform the operation of transferring the wafer 126 and stops, the gas flow in the vacuum transfer chamber in which the vacuum transfer robot 108 is disposed is prevented from being inhibited by the operation. Further, the gate valve 120 does not perform the opening and closing operation because the wafer 126 is not transferred, and it is considered that possibility that the particles such as the gas or the product in the vacuum transfer chamber are brought in via the gate opened inside the vacuum processing chamber 103 is low.

In such an idle state, based upon the command signal from the control part, the valves on all the purge lines 123 provided in the first vacuum transfer chamber 104 and the second vacuum transfer chamber 110 are closed, and the valve on at least one purge line 123 provided in the third vacuum transfer chamber 112 is opened. Further, at the same time, the valve on at least one exhaust pipe 122 provided in the first vacuum transfer chamber 104 is opened, and the valves on all the exhaust pipes 122 provided in the second vacuum transfer chamber 110 and third vacuum transfer chamber 112 are closed. Particularly, in the example illustrated in FIG. 9, the valve on the purge gas line 123 communicating with the gas introduction part 124 disposed at a corner part on the right side (upper right side in the diagram) when viewed from the front of the vacuum processing device 700 of the gate of the side wall connected to the innermost vacuum processing chamber 103 of the third vacuum transfer chamber 112 via the gate valve 120 is opened, and the valve on the exhaust pipe 122 communicating with the exhaust port 125 disposed at a corner part on the left side (lower left side in the diagram) when viewed from the front of the vacuum processing device 700 of the gate of the side wall connected to the lock chamber 105 of the first vacuum transfer chamber 104 via the gate valve 120 is opened. Further, in this state, the vacuum vessels constituting the first vacuum transfer chamber 104, the second vacuum transfer chamber 110, the third vacuum transfer chamber 112, and the vacuum transfer intermediate chambers 111 and 113 disposed therebetween are connected to each other and communicate with each other, thereby being formed as the vacuum transfer unit, and the inside and outside of one sealed space at the inside are airtightly partitioned.

As indicated by an arrow schematically illustrated in FIG. 9, the gas flow in this state is respectively disposed on the left and right sides in the horizontal direction with respect to the center axis passing through the spaces thereof in the front and rear direction when viewing the vacuum processing device 700 from the front, that is, the longest distance among combinations of the gas introduction port 124 and the exhaust port 125 inside the vacuum transfer unit between the third vacuum transfer chamber 112 and the first vacuum transfer chamber 104 via the first vacuum transfer intermediate chamber 111 the second vacuum transfer chamber 110, and the second vacuum transfer intermediate chamber 113. This flow flows through a space inside the vacuum transfer unit, that is, a space between the side walls having no periphery of each of the vacuum transfer robots 108 disposed in the first vacuum transfer chamber 104, the second vacuum transfer chamber 110, and the third vacuum transfer chamber 112, such that the gas flow is generated in the first vacuum transfer intermediate chamber 111 and the second vacuum transfer intermediate chamber 113, thereby making it possible to efficiently transfer the particles causing the contamination of the wafer 126 which are easy to stay therein up to the exhaust port 125. All of the transfer vessels can be kept clean by actively transferring and discharging the contaminants which cannot be transferred in the gas flow illustrated in FIG. 5 and stay in the transfer vessel.

In the embodiment, the exhaust pipe 122 provided in the first vacuum transfer chamber 104 and the purge line 123 provided in the third vacuum transfer chamber 112 illustrated in FIG. 7 are opened, thereby forming the gas flow. On the other hand, the gas introduction port 124 facing the first vacuum transfer chamber 104 and the exhaust port 125 facing the third vacuum transfer chamber 112 are disposed on the right and left sides in the horizontal direction of the center axis in the front and rear direction, and the valves on the respective purge lines 123 and the exhaust pipe 122 may be adjusted on the basis of the command signal from the control part so that the gas flows from the purge line 123 communicating with the first vacuum transfer chamber 104 up to the exhaust pipe 122 of the third vacuum transfer chamber 112 via the first vacuum transfer intermediate chamber 111, the second vacuum transfer chamber 110, and the second vacuum transfer intermediate chamber 113.

Further, only one gas introduction port 124 of the purge line 123 provided in the third vacuum transfer chamber 112 in FIG. 9 is opened, however, the purge gas may be introduced from the plurality of gas introduction ports 124 of the purge line 123 provided in the third vacuum transfer chamber 112. Even in this case, either one of the gas introduction port 124 and the exhaust port 125 is disposed on the right and left sides at the center axis in the front and rear direction in the embodiment, and the plurality of gas introduction ports 124 are desirably disposed on one side in the left and right direction of the above-mentioned axis. In such a configuration, the amount of gas passing through the inside of the vacuum transfer unit in the front and rear direction becomes larger, thereby making it possible to further improve the effect of transferring the particles.

The examples of the gas flows illustrated in FIGS. 7 to 9 are performed by being switched by the command signal from the control part which is not illustrated by the following two patterns. The first pattern is a case where the vacuum transfer robot 108 can be switched to the idle state before the inside of either the vacuum transfer intermediate chamber 111 or the vacuum transfer intermediate chamber 113 is required to be cleaned. In this pattern, before the inside of either the vacuum transfer intermediate chamber 111 or the vacuum transfer intermediate chamber 113 is required to be cleaned, when the control part detects that a predetermined cumulative processing time or the number of the processed wafers 126 which serves as a reference for performing maintenance and inspection of cleaning, and the like of an arbitrary vacuum processing unit 103 is reached, the vacuum transfer robot 108 becomes in the idle state by the command signal from the control part, the selection of the purge gas line 123 and the exhaust pipe 122 provided in the first vacuum transfer chamber 104, the second vacuum transfer chamber 110, and the third vacuum transfer chamber 112 is switched, and then the pattern of the flow of the particles formed by the introduction and the exhaust of the purge gas into and from the inside of the vacuum transfer unit that is formed by the first vacuum transfer chamber 104, the second vacuum transfer chamber 110, the third vacuum transfer chamber 112, the vacuum transfer intermediate chamber 111, and the vacuum transfer intermediate chamber 113, so-called the intake and exhaust of the purge gas is switched from the state where at least any one of the vacuum transfer robots 108 is in operation as illustrated in FIG. 7 or 8 to the idle state where any of the vacuum transfer robots 108 is in the idle state as illustrated in FIG. 9.

The second pattern includes a case in which the contamination does not reach the predetermined limit of contamination to clean the inside of the vacuum transfer intermediate chamber 111 or the vacuum transfer intermediate chamber 113, and the operation of the vacuum processing device 700 or the processing of the wafer 126 is scheduled to continue. This is a state in which a fact that the value of the parameter, which is set by a user in advance, (for example, density, adhesion or amount of deposition) indicating the amount of the contamination or the substance causing the contamination for cleaning the vacuum transfer intermediate chamber 111 or the vacuum transfer intermediate chamber 113 does not reach the limit is detected by the control part based upon the signal from a sensor for detecting the value of the parameter does not reach the limit, and even though any of the vacuum processing units 103 reaches the predetermined cumulative processing time or the number of the processed wafers 126, the operation for manufacturing the semiconductor device based upon processing of the wafer 126 continues until all of the unprocessed wafers 126 stored inside the cassette placed on the cassette table 107 are processed by any of the vacuum processing chambers 103, after which the selection of the purge line 123 and the exhaust pipe 122 in the vacuum transfer unit and the flow pattern formed by the intake and exhaust of the purge gas by the selection thereof are switched from the state illustrated in FIG. 7 or 8 to the state illustrated in FIG. 9 based upon the command signal from the control part, such that the intake and exhaust of the purge gas in the idle state continues for the predetermined time.

The control part determines whether or not the cumulative processing time of the vacuum processing unit 103 set in advance by the user or the number of the wafers 126 is reached before starting the processing of the wafers 126 in another cassette after the processing of all the wafers 126 stored inside the respective cassettes placed on the cassette table 107 is completed. When it is determined that the cumulative processing time thereof or the number of the wafers 126 is reached by the control part, before the processing of the wafer 126 in another cassette is started, the selection of the purge line 123 and the exhaust pipe 122 in the vacuum transfer unit of the purge gas and the flow pattern formed by the intake and exhaust of the purge gas by the selection thereof are switched from the state illustrated in FIG. 7 or 8 to the state illustrated in FIG. 9, thereby continuing for the predetermined time.

In the above-mentioned examples, the positions of the gas introduction port 124 and the exhaust port 125 disposed in the vacuum transfer unit are also influenced by a direction of a central axis of the openings thereof. That is, a direction in which the purge gas is introduced from the gas introduction port 124 and a flow direction in which the particles flow into the exhaust port 125 are selected in consideration of a gap in the vacuum transfer chamber around the vacuum transfer robot 108 and a flow in the storage space where the wafer 126 in the vacuum transfer intermediate chamber is placed. On the other hand, in the embodiment, the vacuum vessels forming the respective vacuum transfer chambers have configurations which are at least the same as each other or approximate enough to be regarded as the same as each other when view from above, and are disposed symmetrically with respect to the front and rear direction and the horizontal direction of the vacuum processing devices 100 and 700 passing through the rotation axis thereof when viewed from the vertical direction of the rotation axis at the center of the vacuum transfer robot 108, or disposed axially symmetrically around the vertical rotation axis.

However, since the vacuum transfer robot 108 is not configured to be symmetrical with respect to the aforementioned vertical rotation axis, even though the arbitrary vacuum transfer robot 108 is in the idle state, the flow of the gas supplied into the vacuum transfer chamber in which the vacuum transfer robot 108 is disposed is hard to be symmetrical with respect to the right and left sides in the horizontal direction of the axis in the front and rear direction passing through the center of each gate of the vacuum transfer unit. Therefore, there exists a possibility that the gas and the particles of the reaction product stay in the space of the inside of the vacuum transfer unit on either of the right and left sides with respect to the axis in the front and rear direction, thereby causing the contamination of the wafer 126.

In order to solve the aforementioned problem, in the embodiment or modification, at least any of the gas introduction port 124 and the exhaust port 125 is disposed symmetrically with respect to the axis in the front and rear direction, or at least any of the gas introduction port 124 and the exhaust port 125 disposed on the opposite sides of the axis is disposed facing toward the axis side when viewed from above. Particularly, the gas introduction ports 124 disposed on the inner wall surfaces at the four corners of the respective vacuum transfer chambers are disposed to form the same angle of 45 degrees with respect to each axis in the left and right direction and the front and rear direction passing through the center of each gate or the center of the vacuum transfer robot 108 when viewed from above. That is, particularly, the axis of the center of the opening of the gas introduction port 124 is disposed toward a direction where the rotation axis of the center of the vacuum transfer unit 108 exists. The purge gas is introduced toward the direction, or the particles in the vacuum transfer chamber flow into the exhaust port 125 from the direction. Further, FIG. 5 or 9 illustrates the example in which the gas introduction port 124 is disposed on any side of the axis in the front and rear direction and the exhaust port 125 is disposed the other side, thereby forming the gas flow, and an inverse pattern may be formed with respect to the axis in the front and rear direction, that is, a pattern in which the purge gas is introduced from the left side of each axis in the front and rear direction and is exhausted from the right side in the vacuum transfer unit, and further a flow pattern may be formed from the front side toward the rear side.

That is, in the embodiment and modification, the patterns traversing the axis in the front and rear direction of the flow formed by the intake and exhaust of the purge gas inside the vacuum transfer unit can be configured to be largely divided into four patterns on the front, rear, left, and right side. The intake and exhaust of the purge gas may be appropriately selected in the idle state of the vacuum transfer robot 108 or may be formed by switching at a predetermined time. According to the above-mentioned configuration, the particles of the substance causing the contamination of the wafer 126 in the vacuum side block 102 of the vacuum processing devices 100 and 700 are more efficiently discharged, thereby improving the yield of the processing. Further, the frequency of cleaning the inside of the device can be reduced, thereby improving the operation efficiency of the vacuum processing devices 100 and 700.

What is claimed is:

1. An operation method of a vacuum processing apparatus comprising two vacuum transfer vessels configured to include a transfer chamber in which a wafer which is an object to be processed is transferred in a depressurized inside, and to be disposed side by side in a front and rear direction; an intermediate chamber vessel configured to be disposed to be connected between the two vacuum transfer vessels, and to include an intermediate chamber communicating with each of the two vacuum transfer chambers therein; and a plurality of vacuum processing vessels configured to be connected to each of the two vacuum transfer vessels, and to include a processing chamber in which the wafer is transferred and processed by using plasma therein, which transfers the wafer to each of the plurality of vacuum processing vessels and processes the wafer therein, wherein
   each of the two vacuum transfer vessels includes:
      a transfer robot configured to transfer the wafer to the inside of each of the vacuum transfer chambers; at least one supply port configured to include an opening on an inner wall of the vacuum transfer chamber behind the transfer robot in the front and rear direction, and to supply a gas toward a center side of the vacuum transfer chamber; and one exhaust port configured to include an opening on an inner wall of the vacuum transfer chamber in front of the transfer robot, and to exhaust the gas, wherein the at least one supply port and the exhaust port are respectively disposed on either right or left side in a front and rear axial direction passing through a center of the intermediate chamber, and
   the operation method comprises:
      performing a first operation in which, in each of the two vacuum transfer vessels, a gas is supplied between a pair of the at least one supply port and the exhaust port in the front and rear direction among the gas supply ports and the exhaust ports of the two vacuum transfer vessels; and
      performing a second operation in which, while the two transfer robots are not in operation, the gas is supplied from the at least one supply port of the one vacuum transfer vessel disposed in rear side of the two vacuum transfer vessels and is introduced, via the intermediate chamber, into the other vacuum transfer vessel disposed in front side of the two vacuum transfer vessels, and the gas is exhausted from the exhaust port of the other two vacuum transfer vessels.

2. The operation method of the vacuum processing apparatus according to claim 1, wherein
   each of the two vacuum transfer vessels is disposed at a diagonal corner part of each of the vacuum transfer chambers sandwiching each of the transfer robots when viewing the at least one supply port and the exhaust port from above.

3. The operation method of the vacuum processing apparatus according to claim 1, wherein
   the gas supply ports, the number of which is equal to or greater than the number of the exhaust ports, are used in the first and second operations.

4. The operation method of the vacuum processing apparatus according to claim 1, wherein
   the vacuum processing vessels are airtightly partitioned from each of the two vacuum transfer chambers in the first and second operations, and the two vacuum transfer chambers and the intermediate chamber are partitioned as one connected chamber in the second operation.

5. The operation method of the vacuum processing apparatus according to claim 1, wherein
   the second operation is performed during maintenance of the inside of the vacuum processing vessel.

6. An operation method of a vacuum processing apparatus comprising:
   two vacuum transfer vessels configured to include a transfer chamber in which a wafer which is an object to be processed is transferred in a depressurized inside, and to be disposed side by side in a front and rear direction;
   an intermediate chamber vessel configured to be disposed to be connected between the two vacuum transfer vessels, and to include an intermediate chamber communicating with each of the two vacuum transfer chambers therein; and
   a plurality of vacuum processing vessels configured to be connected to each of the two vacuum transfer vessels, and to include a processing chamber in which the wafer is transferred and processed by using plasma therein, and which transfers the wafer to each of the plurality of vacuum processing vessels and processes the wafer therein, wherein
   one of the two vacuum transfer vessels includes a first transfer robot configured to transfer the wafer to the inside of the vacuum transfer chamber of the vacuum transfer vessel on the front side of the two vacuum transfer vessels; a first supply port configured to include an opening on an inner wall of the vacuum transfer chamber behind the first transfer robot in the front and rear direction, and to supply a gas toward the inside of the vacuum transfer chamber;
   and at least a first exhaust port configured to include an opening on an inner wall of the vacuum transfer chamber in front of the transfer robot, and to exhaust the gas, wherein the first supply port and the first exhaust port are respectively disposed on either right or left side in a front and rear axial direction passing through a center of the intermediate chamber,
   the other of the two vacuum transfer vessels includes a second transfer robot configured to transfer the wafer to the inside of the vacuum transfer chamber of the vacuum transfer vessel on the rear side of the two vacuum transfer vessels; a second supply port configured to include an opening on an inner wall of the vacuum transfer chamber behind the second transfer robot in the front and rear direction, and to supply a gas toward the inside of the vacuum transfer chamber; and at least one second exhaust port configured to include an opening on an inner wall of the vacuum transfer chamber in front of the transfer robot, and to exhaust the gas, wherein the second supply port and the at least one second exhaust port are respectively disposed on either right or left side in a front and rear axial direction passing through a center of the intermediate chamber, and the operation method comprising:
performing a first operation in which a gas is supplied from the first supply port and the gas is exhausted from the at least one second exhaust port in the two vacuum transfer vessels and the first and the at least one second exhaust port being disposed between the transfer robots, and a second operation in which, while the first and second transfer robots are not in operation, a gas is supplied from the second supply port of the other vacuum transfer vessel and is introduced into the one vacuum transfer vessel via the intermediate chamber, and the gas is exhausted from the first exhaust port of the one vacuum transfer vessel.

7. The operation method of the vacuum processing apparatus according to claim 6, wherein
each of the two vacuum transfer vessels is disposed at a diagonal corner part of each of the vacuum transfer chambers sandwiching each of the transfer robots when viewing the supply port and the at least one exhaust port from above.

8. The operation method of the vacuum processing apparatus according to claim 6, wherein
the gas supply ports, the number of which is equal to or greater than the number of the exhaust ports, are used in the first and second operations.

9. The operation method of the vacuum processing apparatus according to claim 6, wherein
the vacuum processing vessels are partitioned from each of the two vacuum transfer chambers in the first and second operation, and the two vacuum transfer chambers and the intermediate chamber are partitioned as one connected chamber in the second operation.

10. The operation method of the vacuum processing apparatus according to claim 6, wherein
the second operation is performed during maintenance of the inside of the vacuum processing vessel.

* * * * *